(12) United States Patent
Park

(10) Patent No.: US 12,439,759 B2
(45) Date of Patent: Oct. 7, 2025

(54) TILED DISPLAY DEVICE

(71) Applicant: Samsung Display Co., LTD., Yongin-si (KR)

(72) Inventor: Dong Jin Park, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 637 days.

(21) Appl. No.: 17/701,091

(22) Filed: Mar. 22, 2022

(65) Prior Publication Data
US 2022/0415963 A1 Dec. 29, 2022

(30) Foreign Application Priority Data
Jun. 25, 2021 (KR) ........................ 10-2021-0082848

(51) Int. Cl.
H10H 29/14 (2025.01)
H10H 20/855 (2025.01)
H10H 20/857 (2025.01)
H10H 20/858 (2025.01)

(52) U.S. Cl.
CPC ........ H10H 29/142 (2025.01); H10H 20/855 (2025.01); H10H 20/857 (2025.01); H10H 20/858 (2025.01)

(58) Field of Classification Search
CPC ..... H01L 27/156; H01L 27/124; H01L 33/58; H01L 33/62; H01L 33/64; H01L 25/0753; H01L 25/167; H01L 25/16; H01L 25/03; G09F 9/3026; G09F 9/3023; H10H 29/142; H10H 20/855; H10H 20/857; H10H 20/858; H10K 59/10; H10K 59/1213; H10K 59/126; H10K 59/18; H10K 59/19; H10K 50/10; H10K 50/11
See application file for complete search history.

(56) References Cited

U.S. PATENT DOCUMENTS

| 2006/0108913 | A1* | 5/2006 | Cok | ........................ H10K 59/18 313/500 |
| 2015/0221712 | A1* | 8/2015 | Yu | ........................ H10K 59/131 438/23 |
| 2017/0358637 | A1* | 12/2017 | Lee | ........................ G06F 3/0446 |
| 2020/0295120 | A1 | 9/2020 | Bower et al. | |
| 2021/0336167 | A1* | 10/2021 | Li | ........................ H10K 59/12 |

FOREIGN PATENT DOCUMENTS

| JP | 5764616 | 8/2015 |
| KR | 2001-0093018 | 10/2001 |
| KR | 10-1476688 | 12/2014 |

* cited by examiner

Primary Examiner — Ajay Ojha
Assistant Examiner — Sandra Milena Rodriguez Villan
(74) Attorney, Agent, or Firm — Womble Bond Dickinson (US) LLP

(57) ABSTRACT

A tiled display device includes a base part including a first substrate and a pad part, display devices disposed on the base part, each of the display devices including a second substrate and a display layer disposed on an upper surface of the second substrate, and a conductive adhesive part disposed between the base part and the display devices and electrically connecting the base part to the display devices.

20 Claims, 23 Drawing Sheets

TILED DISPLAY DEVICE

CROSS-REFERENCE TO RELATED APPLICATION(S)

This application claims priority to and benefits of Korean Patent Application No. 10-2021-0082848 under 35 U.S.C. § 119 filed on Jun. 25, 2021, in the Korean Intellectual Property Office, the entire contents of which are incorporated herein by reference.

BACKGROUND

1. Technical Field

The disclosure relates to a tiled display device.

2. Description of the Related Art

As the information society develops, demands for display devices for displaying images are increasing in various forms. For example, display devices are being applied to various electronic devices such as smartphones, digital cameras, notebook computers, navigation devices, and smart televisions. The display devices may be flat panel display devices such as liquid crystal display devices, field emission display devices, and organic light emitting display devices. Among these flat panel display devices, a light emitting display device may include a light emitting element that enables each pixel of a display panel to emit light by itself. Thus, the light emitting display device can display an image without a backlight unit that provides light to the display panel.

In case that a display device is manufactured to have a large size, a defect rate of light emitting elements may increase due to an increase in the number of pixels, and productivity or reliability may be reduced. To solve these problems, a tiled display device may be implemented to provide a large screen by connecting relatively small display devices. The tiled display device may include a boundary part called a seam between the display devices due to a non-display area or a bezel area of each of the display devices adjacent to each other. In case that one image is displayed on the entire screen, the boundary part between the display devices gives a sense of separation to the entire screen, thereby reducing the degree of immersion in the image.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide a tiled display device in which a base substrate (a first substrate) of a base part may include a material having a same coefficient of thermal expansion as that of a base substrate (a second substrate) of a display device to prevent damage to the display device.

Aspects of the disclosure also provide a tiled display device in which a conductive adhesive part electrically connecting a base part and display devices may include a light blocking material to prevent an area between the display devices from being recognized by a user.

Aspects of the disclosure also provide a tiled display device in which the arrangement and number of display devices can be readily designed by forming a pad part on a base part on which display devices are disposed and omitting the pad part from each of the display devices.

However, aspects of the disclosure are not restricted to those set forth herein. The above and other aspects of the disclosure will become more apparent to one of ordinary skill in the art to which the disclosure pertains by referencing the detailed description of the disclosure given below.

According to an embodiment, a tiled display device may include a base part comprising a first substrate; and a pad part; display devices disposed on the base part, each of the display devices comprising a second substrate; and a display layer disposed on an upper surface of the second substrate; and a conductive adhesive part disposed between the base part and the display devices and electrically connecting the base part to the display devices.

The conductive adhesive part may comprise a black material.

The conductive adhesive part may comprise an adhesive layer bonding the first substrate and the second substrate.

The display devices may be spaced apart from each other on the first substrate. The conductive adhesive part may be exposed in an area between the display devices.

The first substrate may comprise a first area; and a pad area spaced apart from a side of the first area. The display devices may be disposed on the first area of the first substrate. The pad part may be disposed on the pad area of the first substrate.

The conductive adhesive part may be disposed entirely on the first area of the first substrate.

The base part may comprise an external signal line disposed on an upper surface of the first substrate and electrically connected to the pad part.

Each of the display devices may comprise a first connection pattern electrically connected to the external signal line of the base part. The first connection pattern may be disposed on a lower surface of the second substrate.

Each of the display devices may comprise a second connection pattern included in the display layer and exposed on a lower surface of the display layer. The second connection pattern may be electrically connected to the first connection pattern through a contact hole penetrating the second substrate.

The first connection pattern may be disposed in the contact hole. A lower surface of the second connection pattern may be disposed on the upper surface of the second substrate.

The conductive adhesive part may entirely overlap the external signal line and the first connection pattern.

The second substrate and the first substrate may comprise a material having a same coefficient of thermal expansion.

The conductive adhesive part may comprise an anisotropic conductive film.

The tiled display device may further comprise a light blocking coating layer disposed on a side surface of the second substrate.

According to an embodiment, a tiled display device may include a bottom plate; a heat dissipation part disposed on the bottom plate; and tiled displays spaced apart from each other on the heat dissipation part. Each of the tiled displays comprises a base part comprising a first substrate and a pad part; display devices disposed on the base part, and each of the display devices comprising a second substrate; and a display layer disposed on an upper surface of the second substrate; and a conductive adhesive part disposed between the base part and the display devices and electrically connecting the base part to the display devices, the conductive adhesive part comprising a black material.

The tiled display device may further comprise a light blocking layer overlapping an area between the tiled displays and disposed on the bottom plate.

The first substrate may comprise a first area; and a pad area spaced apart from a side of the first area. The display devices may be disposed on the first area of the first substrate. The pad part may be disposed on the pad area of the first substrate.

The conductive adhesive part may be disposed entirely on the first area of the first substrate.

The base part may comprise an external signal line disposed on an upper surface of the first substrate and electrically connected to the pad part. Each of the display devices may comprise a first connection pattern electrically connected to the external signal line of the base part. The first connection pattern may be disposed on a lower surface of the second substrate.

Each of the display devices may comprise a second connection pattern included in the display layer and exposed on a lower surface of the display layer. The second connection pattern may be electrically connected to the first connection pattern through a contact hole penetrating the second substrate.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION OF THE EMBODIMENTS

Figure 1:
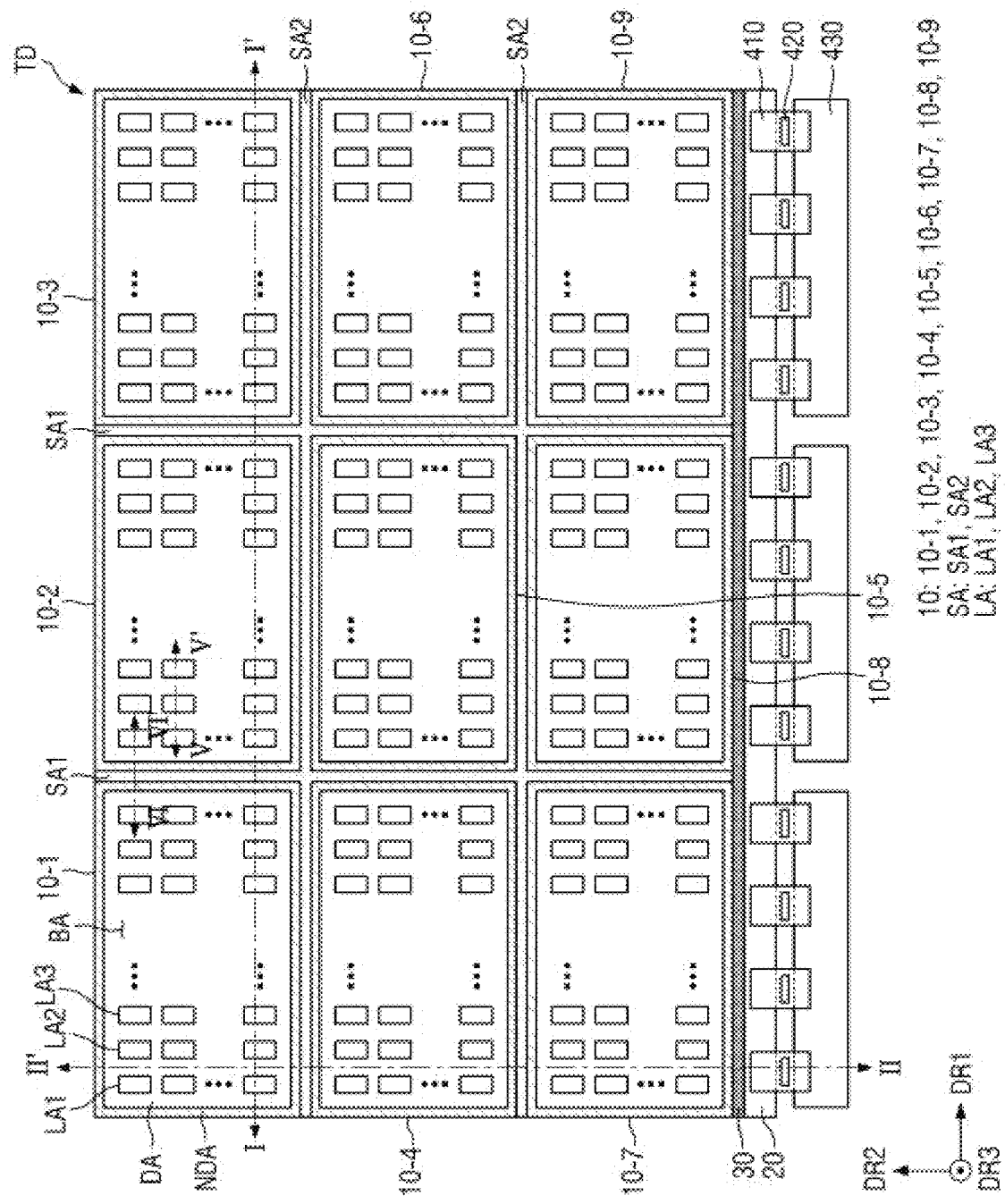
FIG. 1 is a schematic plan view of a tiled display device according to an embodiment.

In the following description, for the purposes of explanation, numerous details are set forth in order to provide a thorough understanding of various embodiments or implementations of the disclosure. As used herein "embodiments" and "implementations" are interchangeable words that are non-limiting examples of devices or methods employing one or more of the disclosure disclosed herein. It is apparent, however, that various embodiments may be practiced without these details or with one or more equivalent arrangements. In other instances, structures and devices are shown in block diagram form in order to avoid unnecessarily obscuring various embodiments. Further, various embodiments may be different, but do not have to be exclusive. For example, shapes, configurations, and characteristics of an embodiment may be used or implemented in other embodiments without departing from the disclosure.

Unless otherwise specified, the illustrated embodiments are to be understood as providing features of varying detail of a number of ways in which the disclosure may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

Further, the X-axis, the Y-axis, and the Z-axis are not limited to three axes of a rectangular coordinate system, and thus the X-, Y-, and Z-axes, and may be interpreted in a broader sense. For example, the X-axis, the Y-axis, and the Z-axis may be perpendicular to one another, or may represent different directions that are not perpendicular to one another.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ.

Although the terms "first," "second," and the like may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (for example, as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (for example, rotated about 90 degrees or at other orientations), and, as such, the spatially relative descriptors used herein should be interpreted accordingly.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terminology used herein is for the purpose of describing embodiments and is not intended to be limiting. As used herein, the singular forms, "a," "an," and "the" are intended to include the plural forms as well, unless the context clearly indicates otherwise.

Moreover, the terms "comprises," "comprising," "includes," and/or "including," "have" and/or "having" and variations thereof when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation, not as terms of degree, and thus are utilized to account for inherent deviations in measured, calculated, and/or provided values that would be recognized by one of ordinary skill in the art.

For example, "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the illustrated shapes of regions, but are to include deviations in shapes that result from, for instance, manufacturing. In this manner, regions illustrated in the drawings may be schematic in nature, and the shapes of these regions may not reflect actual shapes of regions of a device and are not necessarily intended to be limiting.

Embodiments are described and illustrated in the accompanying drawings in terms of functional blocks, units, parts, and/or modules. Those skilled in the art will appreciate that these blocks, units, parts, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, parts, and/or modules being implemented by microprocessors or other similar hardware, they may be programmed and controlled using software (for example, microcode) to perform various functions discussed herein and may optionally be driven by firmware and/or software. It is also contemplated that each block, unit, part, and/or module may be implemented by dedicated hardware, or as a combination of dedicated hardware to perform functions and a processor (for example, one or more programmed microprocessors and associated circuitry) to perform other functions. Also, each block, unit, part, and/or module of embodiments may be physically separated into two or more interacting and discrete blocks, units, parts, and/or modules without departing from the scope of the disclosure. Further, the blocks, units, parts, and/or modules of embodiments may be physically combined into more complex blocks, units, parts, and/or modules without departing from the scope of the disclosure.

Unless otherwise defined or implied herein, all terms (including technical and scientific terms) used herein have the same meaning as commonly understood by one of ordinary skill in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or overly formal sense, unless clearly so defined herein.

Figure 2:
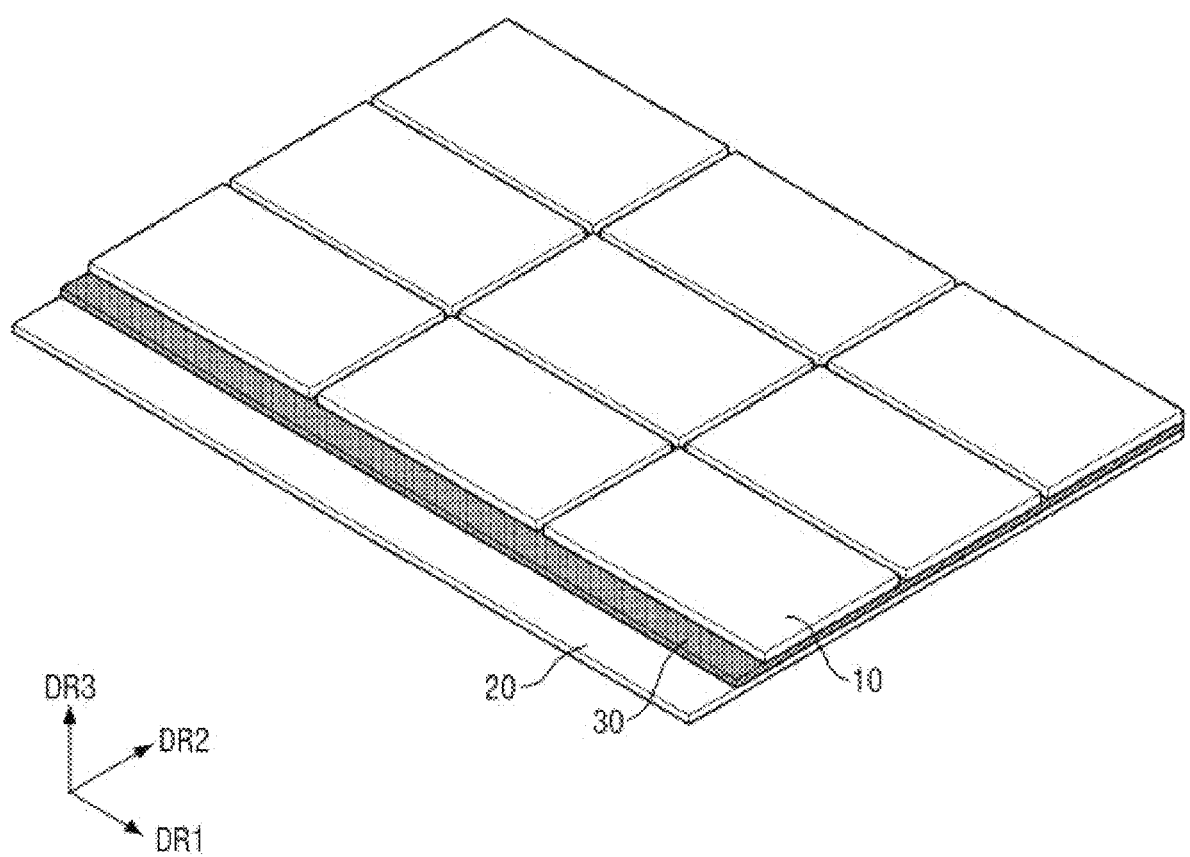
FIG. 2 is a schematic perspective view illustrating a base part, a conductive adhesive part and display devices of the tiled display device according to an embodiment.

FIG. 1 is a schematic plan view of a tiled display device TD according to an embodiment. FIG. 2 is a schematic perspective view illustrating a base part 20, a conductive adhesive part 30 and display devices 10 of the tiled display device TD according to the embodiment.

Referring to FIG. 1, the tiled display device TD displays moving images or still images. The tiled display device TD may refer to any electronic device that provides a display screen. Examples of the tiled display device TD may include televisions, notebook computers, monitors, billboards, the Internet of things (IoT), mobile phones, smartphones, tablet personal computers (PCs), electronic watches, smart watches, watch phones, head-mounted displays, mobile communication terminals, electronic notebooks, electronic books, portable multimedia players (PMPs), navigation devices, game machines, digital cameras and camcorders, all of which provide a display screen.

In the drawings for explaining the tiled display device TD, a first direction DR1, a second direction DR2, and a third direction DR3 are defined. The first direction DR1 and the second direction DR2 may be directions perpendicular to each other in a plane. The third direction DR3 may be a direction perpendicular to a plane in which the first direction DR1 and the second direction DR2 may be located. The third direction DR3 is perpendicular to each of the first direction DR1 and the second direction DR2. In embodiments for explaining the tiled display device TD, the third direction DR3 indicates a thickness direction (or a display direction) of the tiled display device TD.

The tiled display device TD may have a rectangular shape including long sides in the first direction DR1 and short sides in the second direction DR2 in a plan view. The overall shape of the tiled display device TD may be, but is not limited to, a planar shape. It is to be understood that the shapes disclosed herein may include shapes substantially identical or similar to the shapes.

In the embodiments for explaining the tiled display device TD, unless otherwise mentioned, "above" indicates a side of the third direction DR3 and the display direction, and an "upper surface" indicates a surface facing the side of the third direction DR3. In addition, "below" indicates the other side of the third direction DR3 and a direction opposite to the display direction, and a "lower surface" indicates a surface facing the other side of the third direction DR3. In addition, "left," "right," "upper," and "lower" indicate directions in case that the tiled display device TD is seen in a plan view. For example, "right" indicates a side of the first direction DR1, "left" indicates the other side of the first direction DR1, "upper" indicates a side of the second direction DR2, and "lower" indicates the other side of the second direction DR2.

Referring to FIGS. 1 and 2, the tiled display device TD according to the embodiment may include the base part 20, the display devices 10, and the conductive adhesive part 30. The tiled display device TD may further include flexible films 410, display drivers 420, and circuit boards 430.

The base part 20 may provide an area in which the display devices 10 are disposed. The planar shape of the base part 20 may follow the planar shape of the tiled display device TD. In an embodiment in which the tiled display device TD has a rectangular shape having long sides in the first direction DR1 and short sides in the second direction DR2 in a plan view, the base part 20 may have a rectangular shape having long sides in the first direction DR1 and short sides in the second direction DR2 in a plan view. As will be described later, various external signal lines connecting the display devices 10 and the display drivers 420 may be formed in the base part 20, and the base part 20 may also serve to transmit a display driving signal to the display devices 10.

The conductive adhesive part 30 may be disposed on the base part 20. The conductive adhesive part 30 may be disposed substantially entirely on the base part 20 but may expose a peripheral area on at least a side of the base part 20. For example, the conductive adhesive part 30 may be disposed on the base part 20 but may expose a peripheral area on a lower side of the base part 20. Pad parts may be provided in the peripheral area on the lower side of the base part 20 exposed by the conductive adhesive part 30, and the flexible films 410 may be connected to pad electrodes of the pad parts.

The conductive adhesive part 30 may be disposed under or below the display devices 10 to completely cover or overlap the display devices 10. The conductive adhesive part 30 may electrically connect the display devices 10 and the base part 20 and may prevent a separation area SA between the display devices 10 from being seen from above. For example, the conductive adhesive part 30 may have adhesive strength and include an adhesive layer including a black material. For example, the conductive adhesive part 30 may include a light blocking material such as a black pigment or black dye displaying black. The conductive adhesive part 30 may prevent the separation area SA between the display devices 10 to be described later from being seen by a user. The conductive adhesive part 30 may be disposed between the base part 20 and the display devices 10 to electrically connect the base part 20 and the display devices 10.

The display devices 10 may be disposed on the base part 20 with the conductive adhesive part 30 interposed between them. For example, the display devices 10 may be disposed on the conductive adhesive part 30. The display devices 10 may be attached onto the base part 20 through the conductive adhesive part 30 and may be electrically connected to the base part 20. The display devices 10 may be disposed to expose a peripheral area on a side of the base part 20 exposed by the conductive adhesive part 30 on the base part 20. For example, the display devices 10 may be disposed to expose the peripheral area on the lower side of the base part 20.

In the specification, the term "connect" may mean that any one member and another member are connected to each other not only through physical contact but also through another member. It can be understood that any one part and another part may be connected to each other as one integrated member. Further, the connection between any one member and another member can be interpreted to include electrical connection through another member in addition to connection through direct contact.

The display devices 10 may be arranged (or disposed) in a matrix shape on the base part 20. The display devices 10 may be spaced apart from each other in the first direction DR1 and the second direction DR2 in a plan view by a distance. Since the display devices 10 disposed on the base part 20 are spaced apart from each other by a distance, even in case that a display device 10 expands due to heat generated during display driving of the display device 10, the display device 10 can be prevented from being damaged by an adjacent display device 10. Although the display devices 10 are arranged in a 3×3 matrix shape in the drawings, the number and arrangement of the display devices 10 are not limited thereto.

Each of the display devices 10 may have a rectangular shape including long sides in the first direction DR1 and short sides in the second direction DR2 in a plan view. However, the disclosure is not limited thereto, and each of the display devices 10 may also have a rectangular shape including short sides in the first direction DR1 and long sides in the second direction DR2. The display devices 10 may have a same planar shape. The display devices 10 may have a same size. However, the disclosure is not limited thereto, and the display devices 10 may also have different planar shapes and different sizes.

The long sides and/or short sides of the display devices 10 disposed adjacent to each other may be spaced apart to face each other. Some or a number (10-2, 10-4, 10-6 and 10-8) of the display devices 10 included in the tiled display device TD may be disposed at edges of the tiled display devices TD and disposed adjacent to sides of the tiled display device TD, respectively. Some or another of other ones (10-1, 10-3, 10-7 and 10-9) of the display devices 10 included in the tiled display device TD may be disposed adjacent to corners of the tiled display device TD, respectively. The other one (10-5) of the display devices 10 included in the tiled display device TD may be disposed inside the tiled display device TD and may be surrounded by other display devices (10-1, 10-2, 10-3, 10-4, 10-6, 10-7, 10-8 and 10-9).

Each of the display devices 10 may include a display panel that provides a display screen. Examples of the display panel include inorganic light emitting diode display panels, organic light emitting display panels, quantum dot light emitting display panels, plasma display panels, and field emission display panels. A case where an inorganic light emitting diode display panel is applied as an example of the display panel will be described below, but the disclosure is not limited to this case, and other display panels can also be applied within the spirit and the scope of the disclosure.

Each of the display devices 10 may include a display area DA and a non-display area NDA. The display area DA may be an area where a screen can be displayed, and the non-display area NDA may be an area where no screen is displayed. The non-display area NDA may be disposed around the display area DA. The non-display area NDA may entirely or partially surround or may be adjacent to the display area DA.

The shape of the display area DA may follow the shape of each of the display devices 10. For example, the display area DA may have a rectangular planar shape similar to the overall shape of each of the display devices 10. The display area DA may generally occupy the center of each of the display devices 10.

The display area DA may include pixels. A pixel is a repeating minimum unit for display. The pixels may be arranged in a matrix direction. Each of the pixels may be rectangular or square in a plan view. In an embodiment, each pixel may include light emitting elements made of inorganic particles, but the disclosure is not limited thereto.

The display area DA may include light exiting areas LA defined by a light blocking member to be described later and a light blocking area BA around the light exiting areas LA. Each of the light exiting areas LA may be an area where light emitted from a light emitting element layer of a display device 10 is provided to the outside, and the light blocking area BA may be an area through which light emitted from the light emitting element layer does not pass. In the light exiting areas LA, light having a peak wavelength may be provided to the outside. The light exiting areas LA may include a first light exiting area LA1, a second light exiting area LA2, and a third light exiting area LA3.

Each of the first through third light exiting areas LA1 through LA3 may be an area where light having a peak wavelength exits out of a display device 10. The first light exiting area LA1 may emit light of a first color, the second light exiting area LA2 may emit light of a second color, and the third light exiting area LA3 may emit light of a third color. For example, the light of the first color may be red light having a peak wavelength of in a range of about 610 to about 650 nm, the light of the second color may be green light having a peak wavelength in a range of about 510 to about 550 nm, and the light of the third color may be blue light having a peak wavelength in a range of about 440 to about 480 nm. However, the disclosure is not limited thereto.

The first through third light exiting areas LA1 through LA3 may be sequentially and repeatedly arranged along the first direction DR1 in the display area DA of each of the display devices 10. Each of the first through third light exiting areas LA1 through LA3 may have, but is not limited to, a rectangular planar shape that may be longer in the second direction DR2 than in the first direction DR1.

The light blocking area BA may surround the light exiting areas LA1 through LA3. The light blocking member may be disposed in the light blocking area BA to prevent color mixing of light between the first through third light exiting areas LA1 through LA3.

The tiled display device TD may further include the separation area SA between adjacent display devices 10. The separation area SA may be an area between the display devices 10 disposed adjacent to each other. The separation area SA may be surrounded by the non-display areas NDA of the display devices 10 disposed adjacent to each other.

The separation area SA may include a first separation area SA1 and a second separation area SA2. The first separation area SA1 may be an area between display devices 10 disposed adjacent to each other in the first direction DR1, and the second separation area SA2 may be an area between display devices 10 disposed adjacent to each other in the second direction DR2. The first separation area SA1 may extend in the second direction DR2, and the second separation area SA2 may extend in the first direction DR1.

The flexible films 410 may be attached to the pad parts located (or disposed) in the peripheral area on the lower side of the base part 20. Input terminals provided on a side of the flexible films 410 may be attached to the circuit boards 430 by a film attaching process, and output terminals provided on the other side of the flexile films 410 may be attached to the pad parts of the base part 20 by a film attaching process. For example, each of the flexible films 410 may be a flexible film that can bent, such as a tape carrier package or a chip on film. The flexible films 410 may be bent toward the bottom of the tiled display device TD to reduce a bezel area of the tiled display device TD, but the disclosure is not limited thereto.

The display drivers 420 may be mounted on the flexible films 410. For example, the display drivers 420 may be implemented as integrated circuits. Each of the display drivers 420 may receive signals and power from a timing controller or a power supply unit disposed on a circuit board 430 and supply the signals and power to an external signal line of the base part 20.

Each of the circuit boards 430 may support the timing controller and the power supply unit and transmit signals and power output from the timing controller and the power supply unit to the flexible films 410 and the display drivers 420. For example, each of the circuit boards 430 may provide a display driving signal and driving power for displaying an image in pixels to the display drivers 420. To this end, signal transmission lines and voltage lines may be formed on the circuit boards 430.

Figure 3:
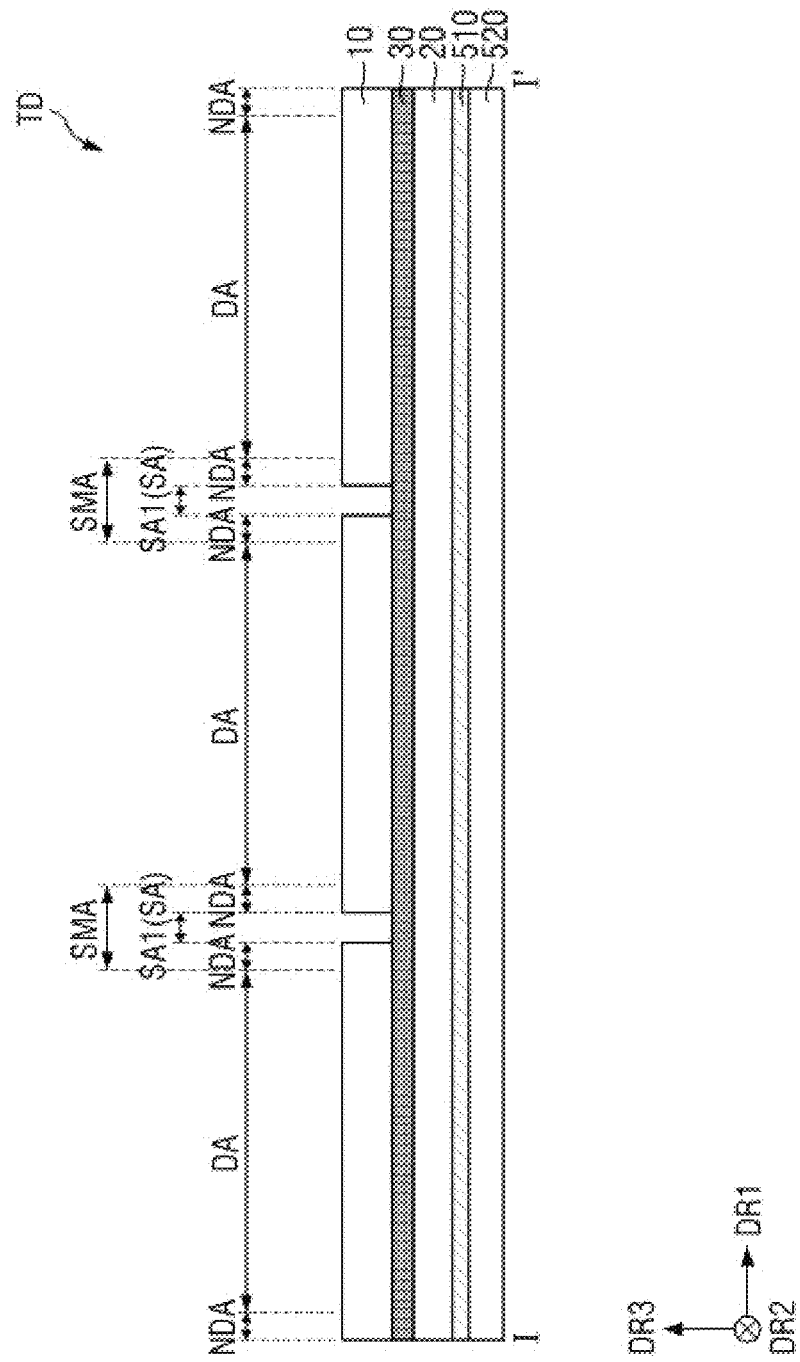
FIG. 3 is a schematic cross-sectional view of the tiled display device taken along line I-I' of FIG. 1.
Figure 4:
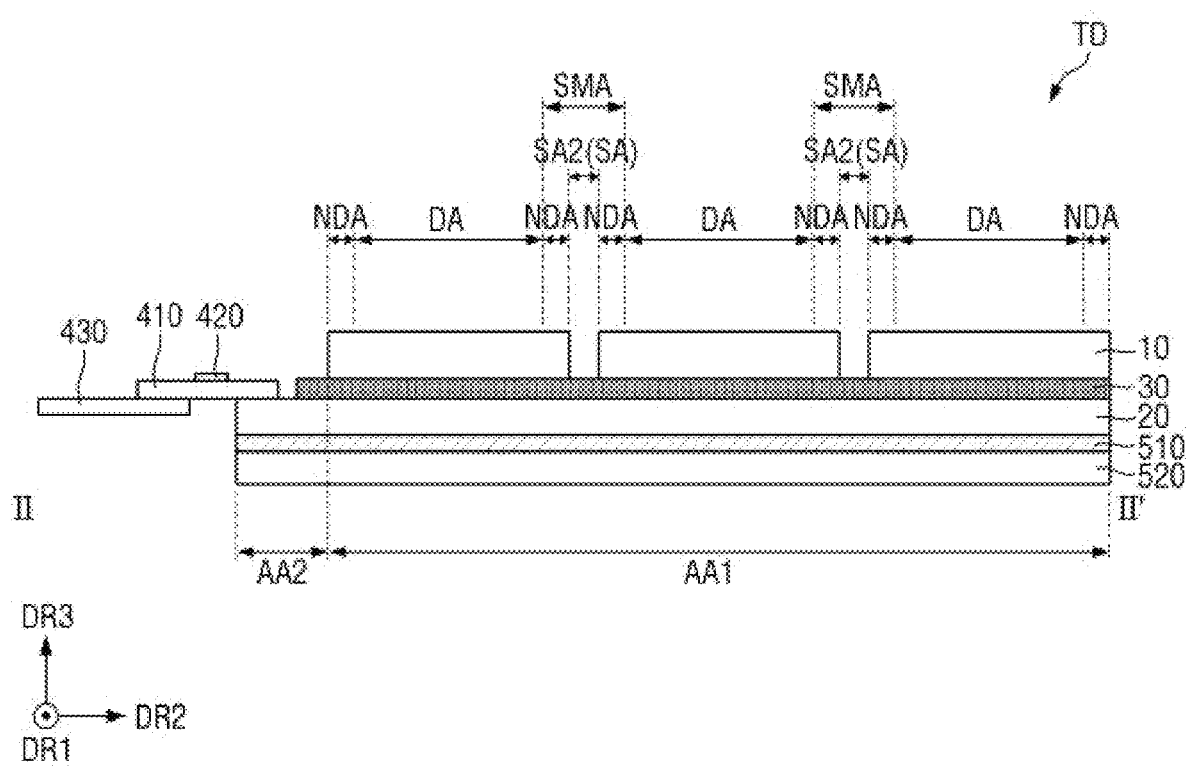
FIG. 4 is a schematic cross-sectional view of the tiled display device taken along line of FIG. 1.

FIG. 3 is a schematic cross-sectional view of the tiled display device TD taken along line I-I' of FIG. 1. FIG. 4 is a schematic cross-sectional view of the tiled display device TD taken along line II-IF of FIG. 1. FIG. 3 is a schematic cross-sectional view of the tiled display device TD taken along the first direction DR1 which may be a long side direction of the tiled display device TD, and FIG. 4 is a schematic cross-sectional view of the tiled display device TD taken along the second direction DR2 which may be a short side direction of the tiled display device TD.

Referring to FIGS. 3 and 4, the tiled display device TD may further include a heat dissipation part 510 and a bottom plate 520.

The bottom plate 520 may support the base part 20, the display devices 10 and the conductive adhesive part 30 disposed thereon. The bottom plate 520 may be formed of a material having a rigidity to prevent the base part 20 and the display devices 10 disposed on the bottom plate 520 from being damaged by external impact. The bottom plate 520 may include a material having a rigidity. For example, the bottom plate 520 may include, but is not limited to, a metal material such as iron, copper, aluminum, or an alloy of the same.

The heat dissipation part 510 may be disposed between the base part 20 and the bottom plate 520. The heat dissipation part 510 may cover or overlap a lower surface of the base part 20 to absorb heat generated from the display devices 10 and disperse the heat outwards in a plan view. For example, the heat dissipation part 510 may include a graphite layer or a layer including carbon nanotubes or the like, but the disclosure is not limited thereto.

The base part 20 may include a first area AA1 and a second area AA2. The first area AA1 may be an area where the display devices 10 are disposed, and the second area AA2 may be an area where the display devices 10 are not disposed. For example, the second area AA2 may be the peripheral area on the lower side of the base part 20. The pad parts may be disposed in the second area AA2.

The conductive adhesive part 30 may be entirely disposed in the first area AA1. In an embodiment, the conductive adhesive part 30 may extend from the first area AA1 to the second area AA2 to also lie in a part of the second area AA2 but expose the other part of the second area AA2. The pad parts may be disposed in the other part of the second area AA2 of the base part 20 which is exposed by the conductive adhesive part 30. However, the disclosure is not limited thereto. In an embodiment, the conductive adhesive part 30 may be entirely disposed in the first area AA1 and the second area AA2, and the pad parts of the base part 20 and the flexible films 410 may be electrically connected by the conductive adhesive part 30.

The display devices 10 may be disposed on the first area AA1 of the base part 20. As illustrated in FIG. 3, the first separation area SA1 may be located between display devices 10 disposed adjacent to each other in the first direction DR1. In the first separation area SA1, the conductive adhesive part 30 may be exposed by the display devices 10. Likewise, as illustrated in FIG. 4, the second separation area SA2 may be located between display devices 10 disposed adjacent to each other in the second direction DR2. In the second separation area SA2, the conductive adhesive part 30 may be exposed by the display devices 10.

The tiled display device TD may further include a boundary area SMA overlapping a part of the first area AA1 of the base part 20. The boundary area SMA may be defined as an area between the display areas DA of adjacent display devices 10. The boundary area SMA may also be referred to as a seam.

The boundary area SMA may include the separation area SA between the display devices 10 disposed adjacent to each other and the non-display areas NDA of the display devices 10 disposed adjacent to each other. A screen may not be displayed in the boundary area SMA. Therefore, the separation area SA may be narrow enough for the boundary area SMA to be unrecognizable by a user. External signal lines disposed in the base part 20 are not visible in the boundary area SMA, and the boundary area SMA needs to display black to minimize reflection of external light. Accordingly, the tiled display device TD may eliminate a sense of separation between the display devices 10 and improve the degree of immersion in images by preventing the boundary area SMA including the non-display area NDA or the separation area SA between the display devices 10 from being recognized.

In the separation area SA, the conductive adhesive part 30 may be exposed by the display devices 10. As described above, the conductive adhesive part 30 exposed by the display devices 10 may display black to prevent the separation area SA from being seen by a user.

The flexible films 410 may be disposed on the second area AA2 of the base part 20. For example, the flexible films 410 may be attached onto an upper surface of the second area AA2 of the base part 20. However, the disclosure is not limited thereto, and the flexible films 410 may also be attached to the lower side of the base part 20 on which the second area AA2 of the base part 20 is located or may be disposed under or below the base part 20.

Figure 5:
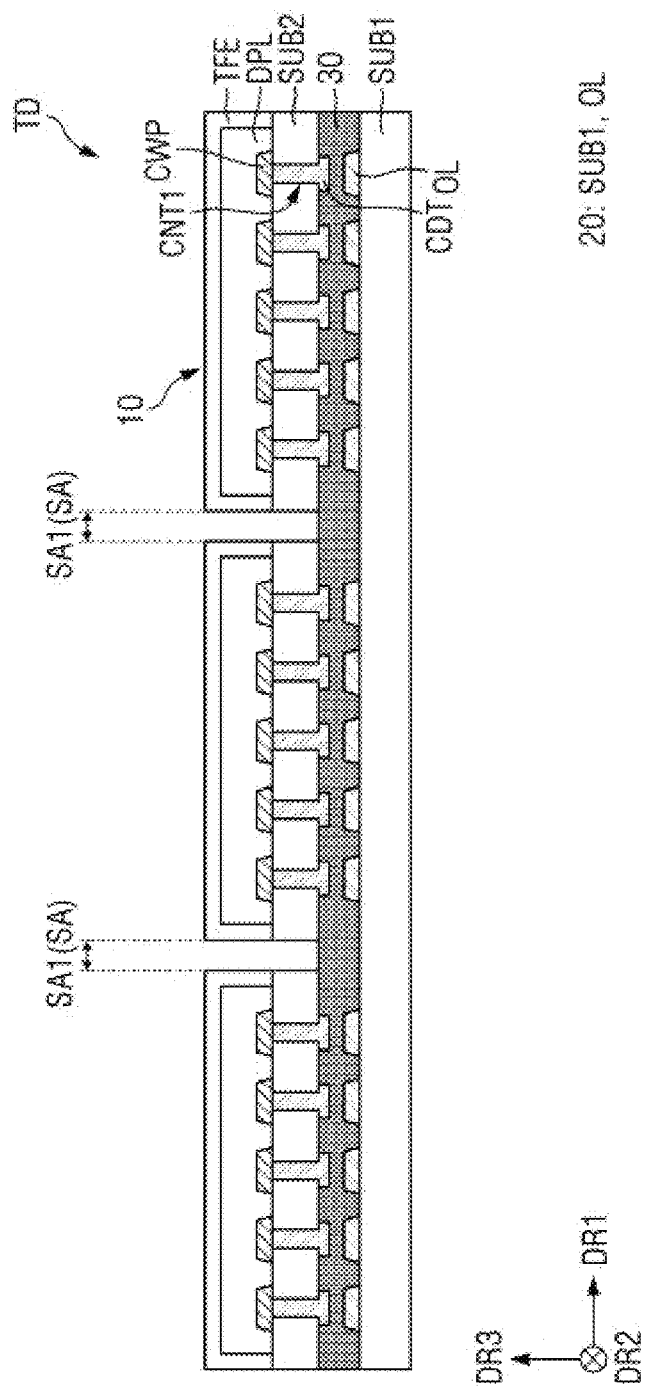
FIG. 5 is a schematic cross-sectional view illustrating the base part, the conductive adhesive part and the display devices of the tiled display device taken along the line I-I' of FIG. 1.
Figure 6:
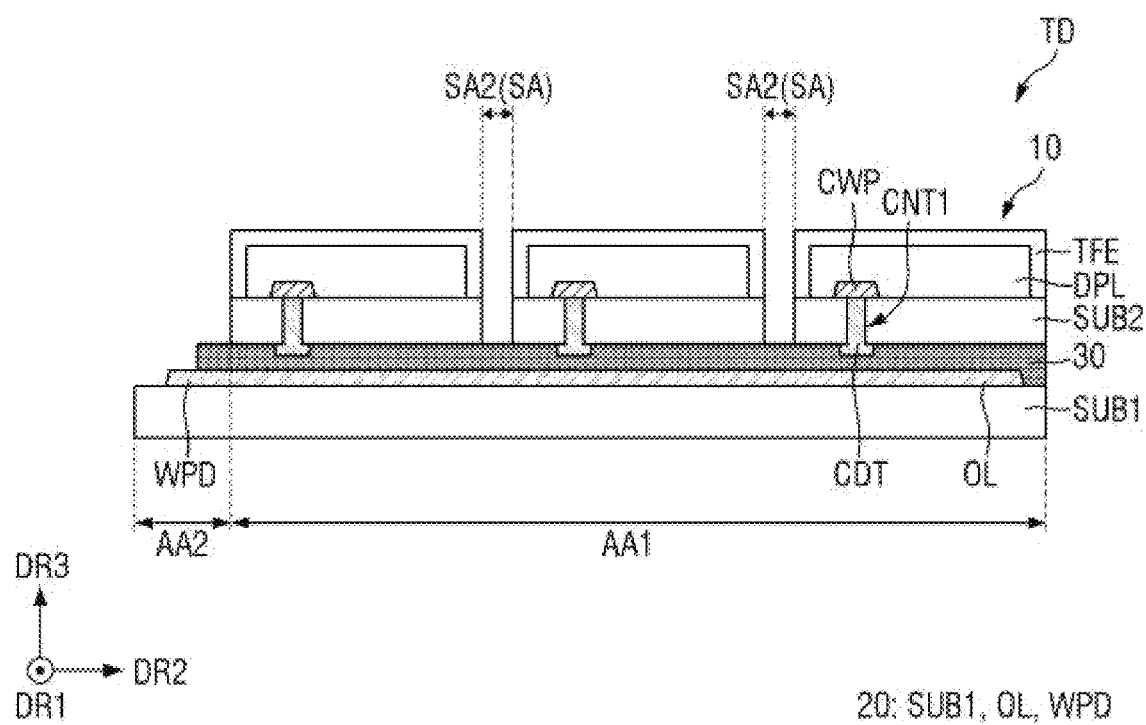
FIG. 6 is a schematic cross-sectional view illustrating the base part, the conductive adhesive part and the display devices of the tiled display device taken along the line II-IF of FIG. 1.

FIG. 5 is a schematic cross-sectional view illustrating the base part 20, the conductive adhesive part 30 and the display devices 10 of the tiled display device TD taken along the line I-I' of FIG. 1. FIG. 6 is a schematic cross-sectional view illustrating the base part 20, the conductive adhesive part 30 and the display devices 10 of the tiled display device TD taken along the line II-IF of FIG. 1.

Referring to FIGS. 5 and 6, in an embodiment, the base part 20 may include a first substrate SUB1, an external signal line OL, and a pad part WPD.

The first substrate SUB1 may be a base substrate of the base part 20. The first substrate SUB1 may be made of an insulating material such as polymer resin. The first substrate SUB1 may include an insulating material, such as glass, quartz or polymer resin, or an organic material. The first substrate SUB1 may be a rigid substrate but may also be a flexible substrate that can be bent, folded, rolled or the like within the spirit and the scope of the disclosure. For example, the rigid substrate may include a glass substrate, and the flexible substrate may include polyimide (PI).

The external signal line OL and the pad part WPD may be disposed on the first substrate SUB1. The external signal line OL and the pad part WPD may be provided in plural numbers. Pad parts WPD may correspond to external signal lines OL, respectively, and may be electrically connected to the external signal lines OL.

The external signal lines OL may be disposed in the first area AA1. The external signal lines OL disposed on the first substrate SUB1 may extend in the second direction DR2 to cross or intersect the first area AA1 in the second direction DR2. The external signal lines OL may be spaced apart from each other in the first direction DR1.

The external signal lines OL may extend in the second direction DR2 to cover or overlap the display devices 10 disposed adjacent to each other in the second direction DR2 from under or below the display devices 10 as illustrated in FIG. 6. Therefore, the external signal lines OL may partially overlap the second separation area SA2 between the display devices 10 disposed adjacent to each other in the second direction DR2. On the other hand, as illustrated in FIG. 5, the external signal lines OL spaced apart from each other in the first direction DR1 may not be disposed in the first separation area SA1 between the display devices 10 disposed adjacent to each other in the first direction DR1.

The pad parts WPD may be disposed in the second area AA2. The pad parts WPD may be electrically connected to the external signal lines OL. Although the pad parts WPD and the external signal lines OL may form a single layer in the drawings, the disclosure is not limited thereto. For example, the pad parts WPD may be spaced apart from the external signal lines OL and may be electrically connected to the external signal lines OL through fan-out lines disposed between the pad parts WPD and the external signal lines OL. The pad parts WPD and the external signal signals OL may be formed of a same layer but may be connected through the fan-out lines or may be formed of different layers. The flexible films 410 may be attached to the pad parts WPD. The external signal lines OL and the pad parts WPD may each include a conductive material.

In an embodiment, each of the display devices 10 may include a second substrate SUB2, a display layer DPL including a first connection pattern CWP, an encapsulation layer TFE, and a second connection pattern CDT.

The second substrate SUB2 may be a base substrate of each of the display devices 10. The second substrate SUB2 may support the display layer DPL. The second substrate SUB2 may include contact holes CNT1 penetrating the second substrate SUB2. The second connection pattern CDT electrically connecting the base part 20 and the display layer DPL may be disposed in each of the contact holes CNT1.

The second substrate SUB2 may be made of an insulating material such as polymer resin. The second substrate SUB2 may include an insulating material, such as glass, quartz or polymer resin, or an organic material. The second substrate SUB2 may be a rigid substrate but may also be a flexible substrate that can be bent, folded, rolled or the like within the spirit and the scope of the disclosure. For example, the rigid substrate may include a glass substrate, and the flexible substrate may include polyimide (PI).

In an embodiment, the second substrate SUB2 may include a material having the same coefficient of thermal expansion as that of the first substrate SUB1. In an embodiment, the second substrate SUB2 and the first substrate SUB1 may include a same material or a similar material. In an embodiment, the second substrate SUB2 and the first substrate SUB1 may include different materials, but may include materials having the same coefficient of thermal expansion. For example, in case that the first substrate SUB1 may include a glass substrate, the second substrate SUB2 may also include a glass substrate. In case that the first substrate SUB1 may include a polyimide (PI) substrate, the second substrate SUB2 may also include a polyimide (PI) substrate.

Since the first substrate SUB1 and the second substrate SUB2 include materials having the same coefficient of thermal expansion, in case that a display device 10 expands due to heat generated by the display driving of the display device 10, the base part 20 disposed under or below the display device 10 may also expand together with the display device 10. For example, in case that the second substrate SUB2 of the display device 10 expands to the separation area SA, the first substrate SUB1 in an area overlapping the separation area SA may also expand with the same coefficient of thermal expansion as the second substrate SUB2. Accordingly, a width of the separation area SA may increase. Therefore, since the first substrate SUB1 also expands in case that the second substrate SUB2 expands, another display device 10 disposed adjacent to the display device 10 may be kept separate from the display device 10 on the base part 20 by a distance. Therefore, it is possible to prevent the display device 10 from contacting the adjacent display device 10 due to the expansion of the display device 10, thereby preventing the display device 10 from being damaged.

The display layer DPL may be disposed on a surface of the second substrate SUB2. For example, the display layer DPL may be disposed on an upper surface of the second substrate SUB2. The display layer DPL may be a layer including pixels to display an image.

The display layer DPL may include the first connection pattern CWP electrically connected to the second connection pattern CDT. The first connection pattern CWP may be disposed on the upper surface of the second substrate SUB2 and may be exposed on a lower surface of the display layer DPL. The first connection pattern CWP may overlap one of the contact holes CNT1 penetrating the second substrate SUB2 and may be electrically connected to the second connection pattern CDT through the contact hole CNT1. The first connection pattern CWP may be connected to the second connection pattern CDT to transmit a signal and power received from the second connection pattern CDT to a signal line and a voltage line of the display device 10.

The encapsulation layer TFE may be disposed on the display layer DPL. The encapsulation layer TFE may be formed to completely cover or overlap upper and side surfaces of the display layer DPL to seal the display layer DPL. For example, the encapsulation layer TFE may include at least one inorganic layer to prevent penetration of oxygen or moisture. The encapsulation layer TFE may include at least one organic layer to protect the display layer DPL from foreign substances such as dust.

The second connection pattern CDT may be disposed on a lower surface of the second substrate SUB2 and sidewalls of the second substrate SUB2 which define one of the contact holes CNT1 penetrating the second substrate SUB2. The second connection pattern CDT may be electrically connected to the first connection pattern CWP through the contact hole CNT1.

Referring to FIG. 5, the second connection pattern CDT and the first connection pattern CWP of each display device 10 may be provided in plural numbers, and second connection patterns CDT and first connection patterns CWP may correspond to each other, respectively.

The second connection patterns CDT may be spaced apart from each other in the first direction DR1. The second connection patterns CDT may respectively overlap the external signal lines OL of the base part 20 in the third direction DR3. The second connection patterns CDT of the display devices 10 and the external signal lines OL of the base part 20 may correspond one-to-one to each other and may be electrically connected to each other, respectively. The second connection patterns CDT and the external signal lines OL may be electrically connected to each other through the conductive adhesive part 30.

The conductive adhesive part 30 may be interposed between the first substrate SUB1 of the base part 20 and the second substrates SUB2 of the display devices 10. The display devices 10 and the base part 20 may be bonded to each other through the conductive adhesive part 30, and the second connection patterns CDT and the external signal lines OL may be electrically connected.

The conductive adhesive part 30 may overlap the separation area SA between the display devices 10 and may be exposed in the separation area SA by the display devices 10 as described above. Therefore, the conductive adhesive part 30 may include a black material so as not to be seen by a user in the separation area SA between the display devices 10. In an embodiment, the conductive adhesive part 30 may include an anisotropic conductive film.

Referring to FIG. 6, the conductive adhesive part 30 may electrically connect the external signal lines OL of the base part 20 which extend in the second direction DR2 and the second connection patterns CDT of each display device 10 which are arranged in the second direction DR2. The second connection patterns CDT of the display devices 10 which are arranged in the same column may be electrically connected to the same external signal line OL through the conductive adhesive part 30.

The pad parts WPD of the base part 20 may receive various voltages or signals from the flexible films 410 and supply the voltages or signals to the first connection patterns CWP of the display layer DPL through the external signal lines OL, the conductive adhesive part 30 and the second connection patterns CDT.

Figure 7:
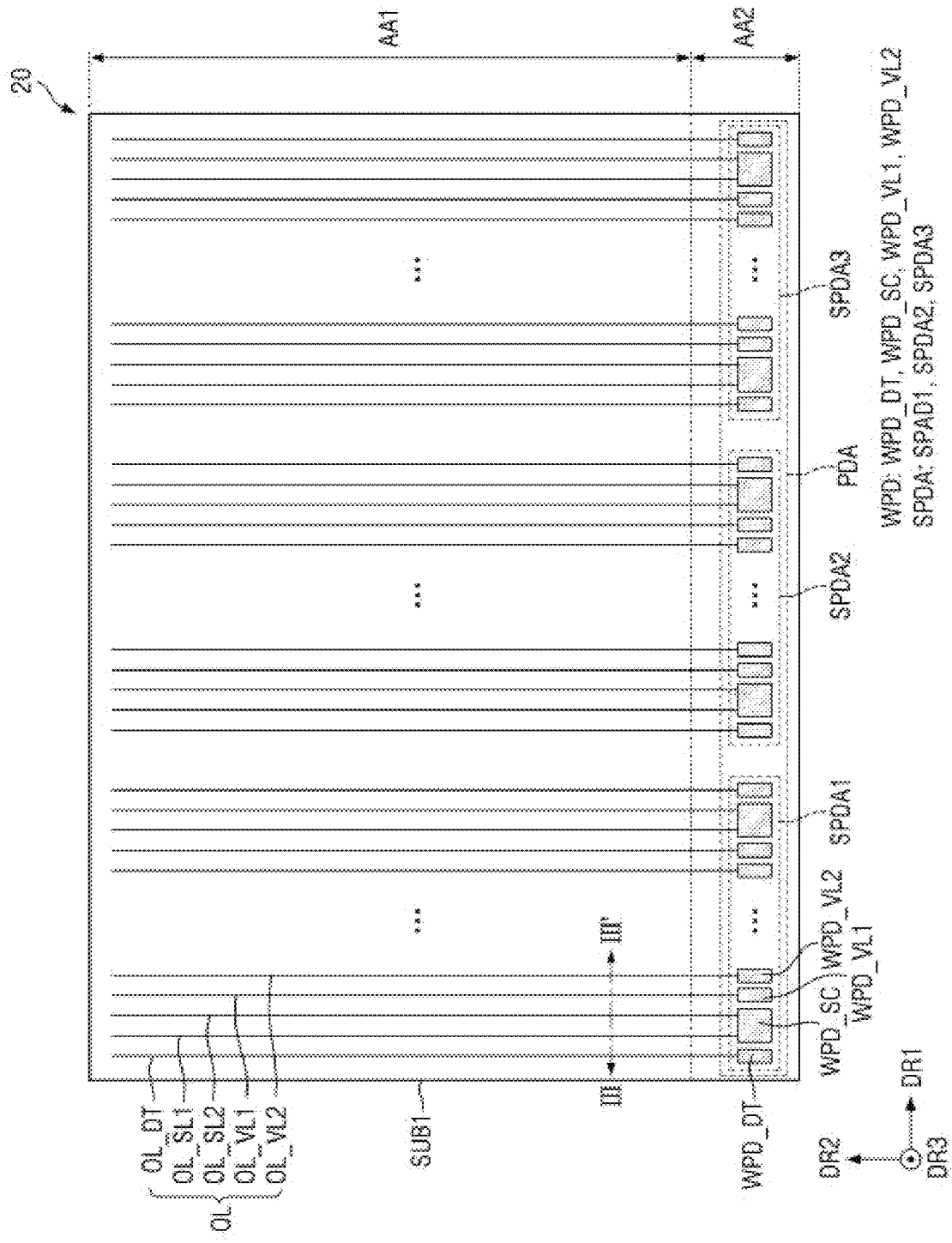
FIG. 7 is a schematic plan view of a base part according to an embodiment.
Figure 8:
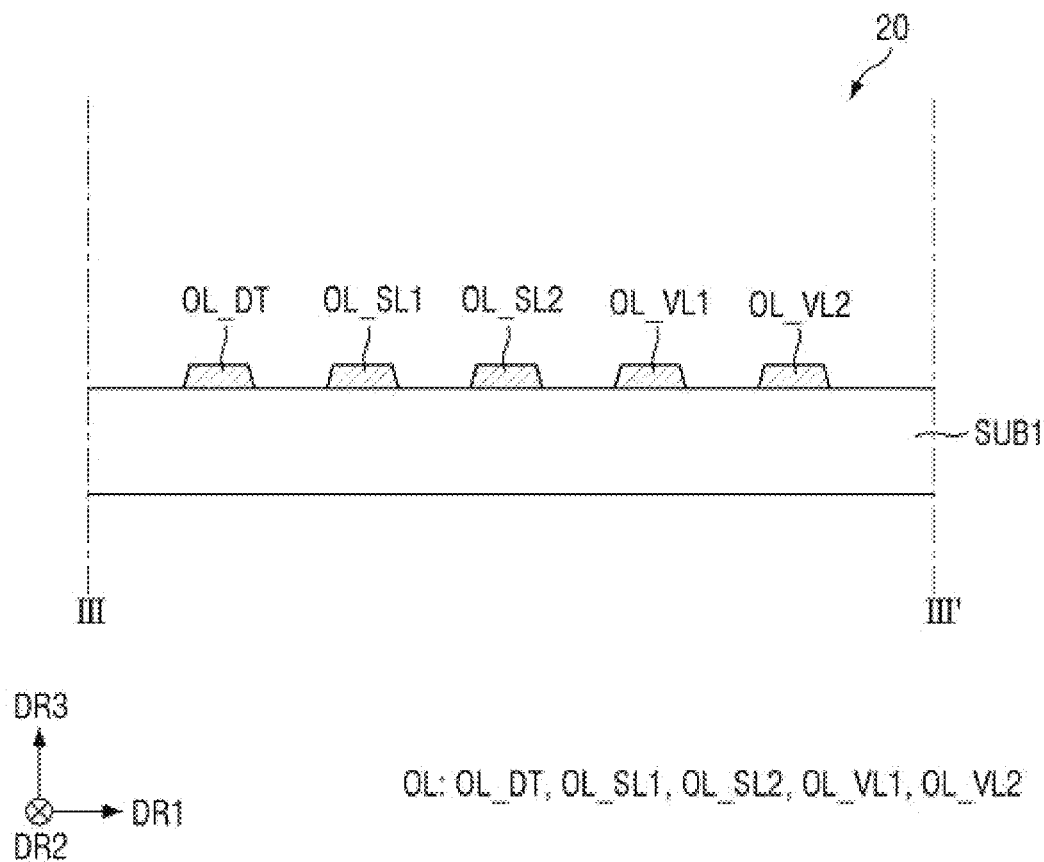
FIG. 8 is a schematic cross-sectional view of an example taken along line of FIG. 7.

FIG. 7 is a schematic plan view of a base part 20 according to an embodiment. FIG. 8 is a schematic cross-sectional view of an example taken along line of FIG. 7.

Referring to FIGS. 1 and 7, the base part 20 may further include a pad area PDA located in the second area AA2. The pad area PDA may be an area where the pad parts WPD are disposed.

The pad area PDA may include sub-pad areas SPDA. In case that display devices 10 are arranged in first through third columns as in the tiled display device TD illustrated in FIG. 1, the sub-pad areas SPDA may include a first sub-pad area SPDA1, a second sub-pad area SPDA2, and a third sub-pad area SPDA3.

The first sub-pad area SPDA1 may be disposed below display devices 10-1, 10-4 and 10-7 disposed in the first column. The second sub-pad area SPDA2 may be disposed below display devices 10-2, 10-5 and 10-8 disposed in the second column. The third sub-pad area SPDA3 may be disposed below display devices 10-3, 10-6 and 10-9 disposed in the third column.

The pad parts WPD may be disposed in each of the first through third sub-pad areas SPDA1 through SPDA3 to supply signals and voltages to display devices 10 disposed in the same column. Therefore, the display devices 10 disposed in the same column may receive external signals from the pad parts WPD disposed in the same sub-pad area SPDA.

As described above, the base part 20 may include the first substrate SUB1, the external signal lines OL, and the pad parts WPD.

Referring to FIGS. 7 and 8, the external signal lines OL may be disposed on an upper surface of the first substrate SUB1 in the first area AA1 of the base part 20, and the pad parts WPD may be connected to the external signal lines OL in the second area AA2 of the base part 20.

External signal lines OL may be provided. The external signal lines OL may include a first external signal line OL_DT, a second external signal line OL_SL1, a third external signal line OL_SL2, a fourth external signal line OL_VL1, and a fifth external signal line OL_VL2. For example, the first external signal line OL_DT may be a line transmitting a data signal to a data line DTL (see FIG. 9) of a display device 10 which will be described later, the second external signal line OL_SL1 and the third external signal line OL_SL2 may be lines respectively transmitting scan signals to a first scan line SL1 (see FIG. 9) and a second scan line SL2 of the display device 10 which will be descried later, the fourth external signal line OL_VL1 may be a line transmitting a first power voltage signal to a first voltage line VL1 (see FIG. 9) of the display device 10 which will be described later, and the fifth external signal line OL_VL2 may be a line transmitting a second power voltage signal to a second voltage line VL2 (see FIG. 9) of the display device 10 which will be described later.

Pad parts WPD may be provided. The pad parts WPD may include a first pad part WPD_DT, a second pad part WPD_SC, a third pad part WPD_VL1, and a fourth pad part WPD_VL2. The first pad part WPD_DT may be connected to a data driver of the display driver 420 to receive a data signal and provide the data signal to the first external signal line OL_DT. The second pad part WPD_SC may be connected to a scan driver of the display driver 420 to receive a scan signal and provide the scan signal to the second and third external signal lines OL_SL1 and OL_SL2. The third pad part WPD_VL1 may receive a first power supply voltage from the power supply unit disposed on the circuit board 430 and provide the first power supply voltage to the fourth external signal line OL_VL1. The fourth pad part WPD_VL2 may receive a second power supply voltage from the power supply unit disposed on the circuit board 430 and provide the second power supply voltage to the fifth external signal line OL_VL2.

The first through fifth external signal lines OL_DT, OL_SL1, OL_SL2, OL_VL1 and OL_VL2 may be disposed on the upper surface of the first substrate SUB1. Each of the first through fifth external signal lines OL_DT, OL_SL1, OL_SL2, OL_VL1 and OL_VL2 may extend in the second direction DR2. The first through fifth external signal lines OL_DT, OL_SL1, OL_SL2, OL_VL1 and OL_VL2 may extend from the first area AA1 of the first substrate SUB1 to the pad area PDA. The first through fifth external signal lines OL_DT, OL_SL1, OL_SL2, OL_VL1 and OL_VL2 may be spaced apart from each other in the first direction DR1 on the upper surface of the first substrate SUB1.

The first through fifth external signal lines OL_DT, OL_SL1, OL_SL2, OL_VL1 and OL_VL2 may be electrically connected to at least one pad part WPD disposed in the pad area PDA located below the first area AA1. For example, the first external signal line OL_DT may be electrically connected to the first pad part WPD_DT, the second and third external signal lines OL_SL1 and OL_SL2 may be electrically connected to the second pad part WPD_SC, the fourth external signal line OL_VL1 may be electrically connected to the third pad part WPD_VL1, and the fifth external signal line OL_VL2 may be electrically connected to the fourth pad part WPD_VL2. The above external signal lines may be connected to different pad parts. The flexible films 410 may be disposed on the pad parts WPD, and the circuit boards 430 and the display drivers 420 may be connected to the base part 20 through the flexible films 410.

In an embodiment, the pad parts WPD may be disposed adjacent to a side of the base part 20 but may not be disposed on other sides. For example, the pad parts WPD may be disposed in the peripheral area on the lower side of the base part 20 but may not be disposed in peripheral areas on upper, left and right sides of the base part 20. For example, the pad parts WPD may be disposed adjacent only to a side (a lower side in the drawings) of the first area AA1 of the base part 20. However, the disclosure is not limited thereto. In an embodiment, the pad parts WPD may be disposed adjacent to lower and right sides of the first area AA1 of the base part 20.

Figure 9:
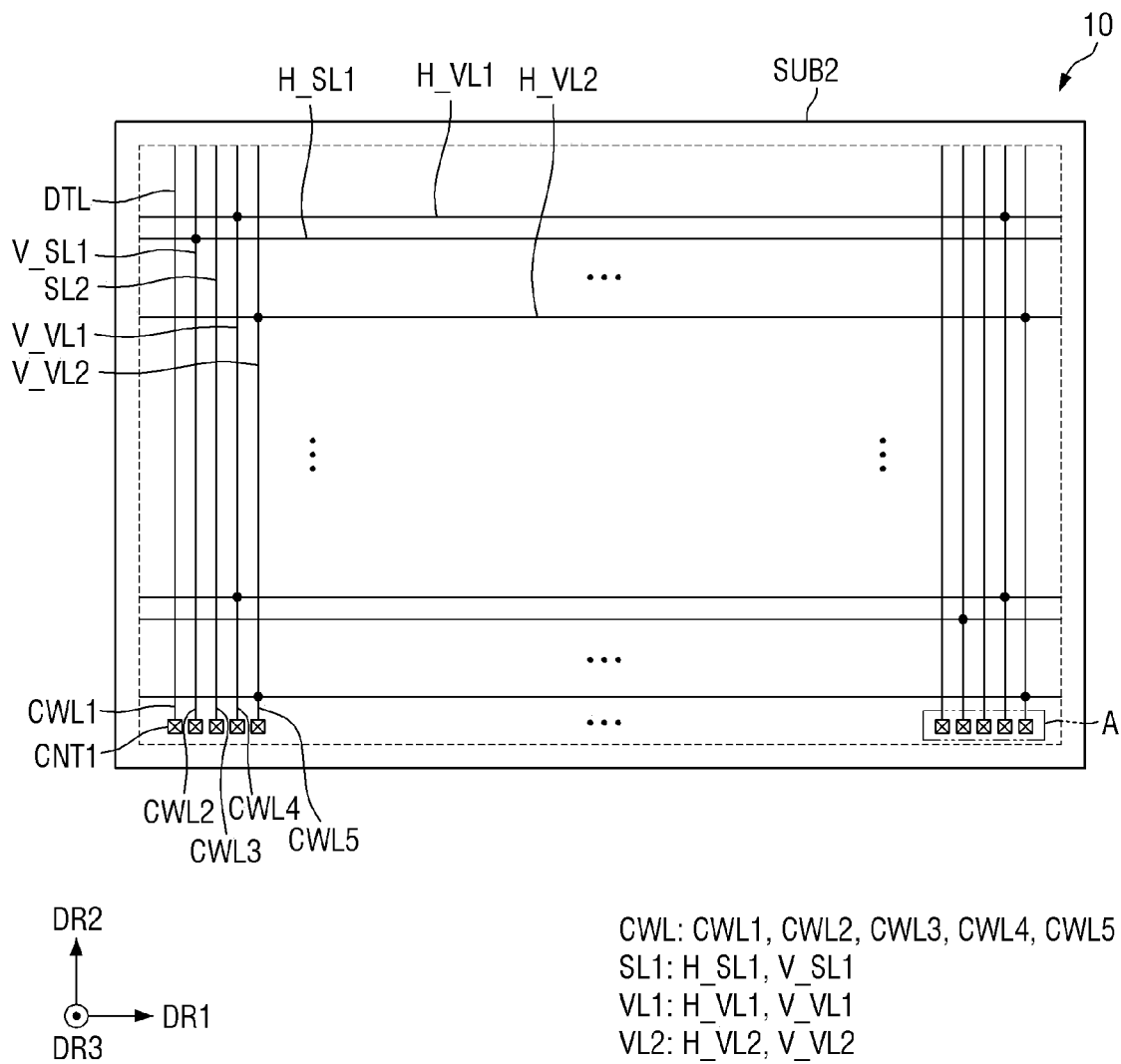
FIG. 9 is a schematic plan view illustrating lines of a display device according to an embodiment.

FIG. 9 is a schematic plan view illustrating lines of a display device 10 according to an embodiment.

Referring to FIG. 9, the display device 10 may include the second substrate SUB2, lines disposed on the second substrate SUB2 in the display area DA, and connection lines CWL connected to the lines.

The lines and the connection lines CWL may be formed in a circuit layer TFTL (see FIG. 13) of the display device 10 which will be described later.

The lines may include data lines DTL, first scan lines SL1, second scan lines SL2, first voltage lines VL1, and second voltage lines VL2. The connection lines CWL may include first connection lines CWL1, second connection lines CWL2, third connection lines CWL3, fourth connection lines CWL4, and fifth connection lines CWL5. Pixels may be formed in pixels areas at the intersection of the data lines DTL and the first scan lines SL1, respectively.

As described above, the second substrate SUB2 may include contact holes CNT1 penetrating the second substrate SUB2. The contact holes CNT1 may be spaced apart from each other. The contact holes CNT1 may be located in an area adjacent to an upper side or a lower side of the second substrate SUB2. In an embodiment, the contact holes CNT1 may be located in the area adjacent to the lower side of the second substrate SUB2.

The contact holes CNT1 may be formed to respectively correspond to the data lines DTL, the first scan lines SL1, the second scan lines SL2, the first voltage lines VL1 and the second voltage lines VL2 included in the display device 10.

The data lines DTL may be disposed on the second substrate SUB2 in the display area DA. The data lines DTL may supply a data signal to each pixel.

The data lines DTL disposed on the second substrate SUB2 may extend in the second direction DR2 and may be spaced apart from each other in the first direction DR1. The first connection lines CWL1 may be disposed between contact holes CNT1, which respectively correspond to the data lines DTL, and the data lines DTL and may be connected to the data lines DTL.

The first scan lines SL1 may be disposed on the second substrate SUB2 in the display area DA. The first scan lines SL1 may include first scan vertical lines V_SL1 and first scan horizontal lines H_SL1. The first scan vertical lines V_SL1 may extend in the second direction DR2 on the second substrate SUB2 and may be spaced apart from each other in the first direction DR1. The second connection lines CWL2 may be disposed between contact holes CNT1, which respectively correspond to the first scan vertical lines V_SL1, and the first scan vertical lines V_SL1 and may be connected to the first scan lines SL1.

The first scan horizontal lines H_SL1 may extend in the first direction DR1 and may be spaced apart from each other in the second direction DR2. Each of the first scan horizontal lines H_SL1 may be electrically connected to any one of the first scan vertical lines V_SL1.

The second scan lines SL2 may be disposed on the second substrate SUB2 in the display area DA. The second scan lines SL2 disposed on the second substrate SUB2 may extend in the second direction DR2 and may be spaced apart from each other in the first direction DR1. The third connection lines CWL3 may be disposed between contact holes CNT1, which respectively correspond to the second scan lines SL2, and the second scan lines SL2 and may be connected to the second scan lines SL2.

The first voltage lines VL1 may be disposed on the second substrate SUB2 in the display area DA. The first voltage lines VL1 may supply a driving voltage or a high-potential voltage to the pixels.

The first voltage lines VL1 may include first voltage vertical lines V_VL1 and first horizontal voltage lines H_VL1. The first voltage vertical lines V_VL1 may extend in the second direction DR2 on the second substrate SUB2 and may be spaced apart from each other in the first direction DR1. The fourth connection lines CWL4 may be disposed between contact holes CNT1, which respectively correspond to the first voltage vertical lines V_VL1, and the first voltage vertical lines V_VL1 and may be connected to the first voltage lines VL1.

The first horizontal voltage lines H_VL1 may extend in the first direction DR1 and may be spaced apart from each other in the second direction DR2. The first horizontal voltage lines H_VL1 may be electrically connected to the first voltage vertical lines V_VL1.

The second voltage lines VL2 may be disposed on the second substrate SUB2 in the display area DA. The second voltage lines VL2 may supply a low-potential voltage to the pixels.

The second voltage lines VL2 may include second voltage vertical lines V_VL2 and second horizontal voltage lines H_VL2. The second voltage vertical lines V_VL2 may extend in the second direction DR2 on the second substrate SUB2 and may be spaced apart from each other in the first direction DR1. The fifth connection lines CWL5 may be disposed between contact holes CNT1, which respectively correspond to the second voltage vertical lines V_VL2, and the second voltage vertical lines V_VL2 and may be connected to the second voltage lines VL2.

The second horizontal voltage lines H_VL2 may extend in the first direction DR1 and may be spaced apart from each other in the second direction DR2. The second horizontal voltage lines H_VL2 may be electrically connected to the second voltage vertical lines V_VL2.

Figure 10:
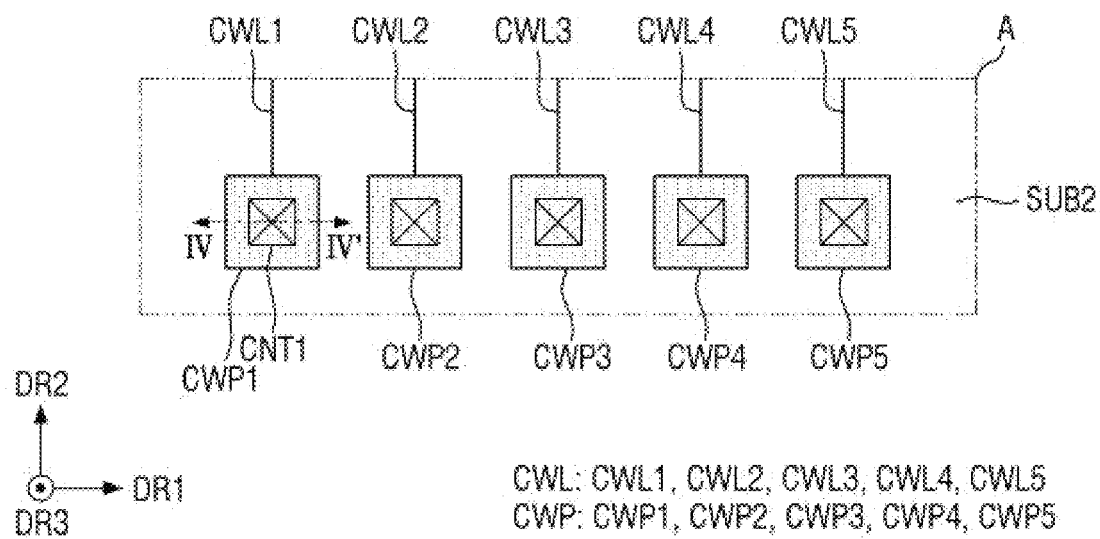
FIG. 10 is an enlarged schematic plan view of area A of FIG. 9.

FIG. 10 is an enlarged schematic plan view of area A of FIG. 9.

Referring to FIGS. 9 and 10, a first connection pattern CWP may include sub-connection patterns spaced apart from each other. For example, the first connection pattern CWP may include a first sub-connection pattern CWP1, a second sub-connection pattern CWP2, a third sub-connection pattern CWP3, a fourth sub-connection pattern CWP4, and a fifth sub-connection pattern CWP5 spaced apart from each other.

The first sub-connection pattern CWP1 may overlap a contact hole CNT1 penetrating the second substrate SUB2 and may be connected to a first connection line CWL1. The first sub-connection pattern CWP1 may be connected to a data line DTL through the first connection line CWL1.

The second sub-connection pattern CWP2 may overlap a contact hole CNT1 penetrating the second substrate SUB2 and may be connected to a second connection line CWL2. The second sub-connection pattern CWP2 may be connected to a first scan line SL1 (for example, a first scan vertical line V_SL1) through the second connection line CWL2.

The third sub-connection pattern CWP3 may overlap a contact hole CNT1 penetrating the second substrate SUB2 and may be connected to a third connection line CWL3. The third sub-connection pattern CWP3 may be connected to a second scan line SL2 through the third connection line CWL3.

The fourth sub-connection pattern CWP4 may overlap a contact hole CNT1 penetrating the second substrate SUB2 and may be connected to a fourth connection line CWL4. The fourth sub-connection pattern CWP4 may be connected to a first voltage line VL1 (for example, a first voltage vertical line V_VL1) through the fourth connection line CWL4.

The fifth sub-connection pattern CWP5 may overlap a contact hole CNT1 penetrating the second substrate SUB2 and may be connected to a fifth connection line CWL5. The fifth sub-connection pattern CWP5 may be connected to a second voltage line VL2 (for example, a second voltage vertical line V_VL2) through the fifth connection line CWL5.

Figure 11:
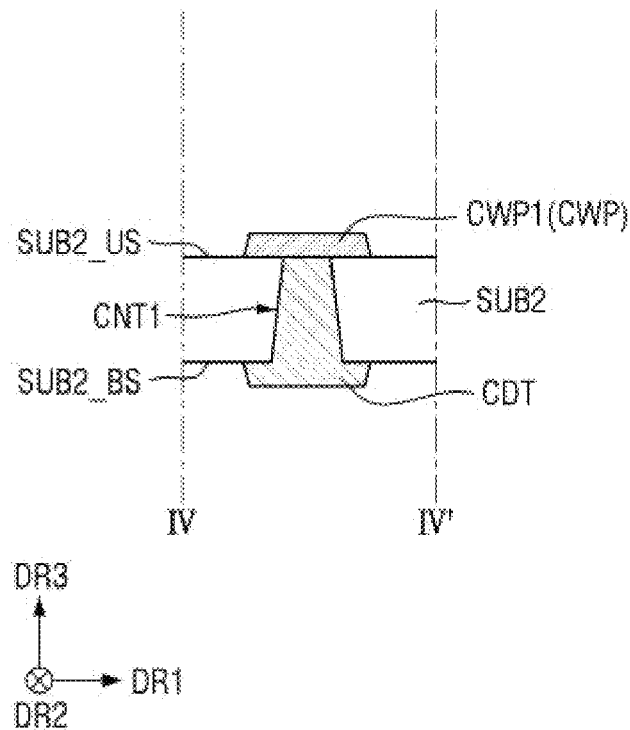
FIG. 11 is a schematic cross-sectional view of an example taken along line IV-IV' of FIG. 10.

FIG. 11 is a schematic cross-sectional view of an example taken along line IV-IV' of FIG. 10.

Referring to FIGS. 10 and 11, the first connection pattern CWP may be disposed on an upper surface SUB2_US of the second substrate SUB2. A lower surface of the first connection pattern CWP may be at least partially exposed by the contact hole CNT1 penetrating the second substrate SUB2. The first connection pattern CWP may overlap the contact hole CNT1 in the third direction DR3 but may not be inserted into the contact hole CNT1.

A second connection pattern CDT may be inserted into the contact hole CNT1. The second connection pattern CDT may be disposed on a lower surface SUB2_BS of the second substrate SUB2 and sidewalls of the second substrate SUB2 which define the contact hole CNT1 penetrating the second substrate SUB2. The second connection pattern CDT may be electrically connected to the first connection pattern CWP through the contact hole CNT1 penetrating the second substrate SUB2.

Figure 12:
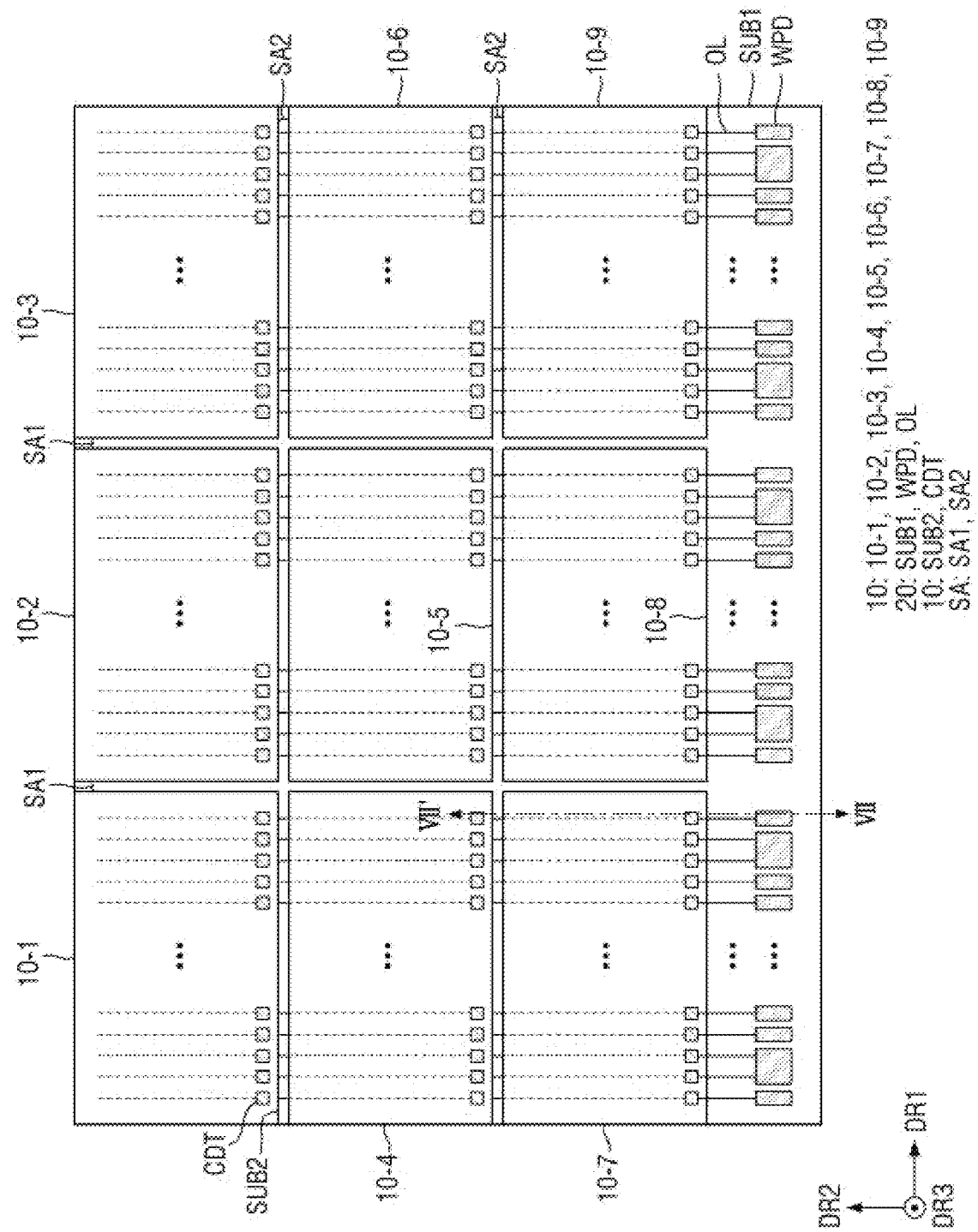
FIG. 12 is a schematic plan view illustrating the relative arrangement of the base part and the display devices according to an embodiment.

FIG. 12 is a schematic plan view illustrating the relative arrangement of the base part 20 and the display devices 10 according to an embodiment.

Referring to FIGS. 7 and 12, display devices 10 may be disposed on external signal lines OL formed on the first substrate SUB1. The second connection patterns CDT included in each of the display devices 10 may overlap the external signal lines OL in the third direction DR3, respectively. The external signal lines OL of the base part 20 and the second connection patterns CDT of the display devices 10 may be connected to each other by the conductive adhesive part 30. This will be described in detail later.

The external signal lines OL may extend in the second direction DR2 under or below display devices 10 arranged in the same column. Therefore, the second connection patterns CDT of the display devices 10 disposed in the same column may be connected to the same external signal lines OL. For example, the display devices 10-1, 10-4 and 10-7 disposed in the first column may be connected to the external signal lines OL connected to the pad parts WPD disposed in the first sub-pad area SPDA1. The display devices 10-2, 10-5 and 10-8 disposed in the second column may be connected to the external signal lines OL connected to the pad parts WPD disposed in the second sub-pad area SPDA2. The display devices 10-3, 10-6 and 10-9 disposed in the third column may be connected to the external signal lines OL connected to the pad parts WPD disposed in the third sub-pad area SPDA3.

The external signal lines OL may be exposed in the second separation area SA2 between adjacent display devices 10 disposed in the same column. The external signal lines OL may not be disposed in the first separation area SA1 between adjacent display devices 10 disposed in the same row.

In the tiled display device TD according to the current embodiment, pad parts may be formed in the base part 20 and may transmit display driving signals to the display devices 10 through the external signal lines OL of the base part 20 and the second connection patterns CDT disposed on lower surfaces of the display devices 10. Therefore, the pad parts may be omitted from each of the display devices 10. Accordingly, in case that the display devices 10 are arranged on the base part 20, the arrangement and number of display devices 10 on the base part 20 can be readily designed because the pad parts are not formed on all sides of the display devices 10. For example, although three display devices 10 are arranged in the same column in FIG. 12, four or more display devices 10 can also be arranged in the same column. Even since no pad part is formed on each side of each display device 10, the arrangement of the display devices 10 may not be limited by a direction in which a pad part faces. Therefore, the arrangement and number of display devices 10 can be readily designed to make the tiled display device TD have a large area.

Figure 13:
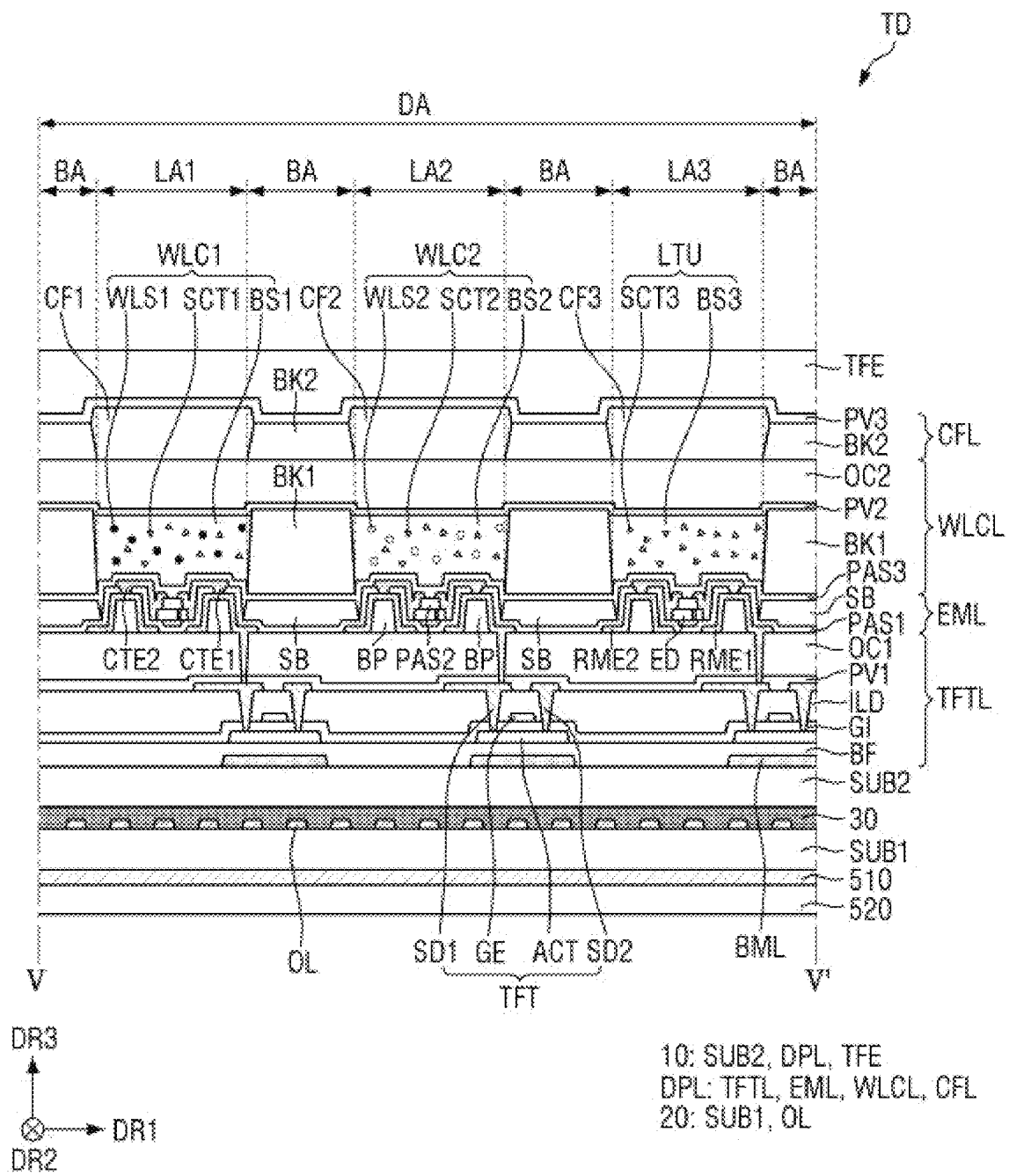
FIG. 13 is a schematic cross-sectional view of the tiled display device taken along line V-V' of FIG. 1.

FIG. 13 is a schematic cross-sectional view of the tiled display device TD taken along line V-V' of FIG. 1. FIG. 13 illustrates the cross-sectional structure of the tiled display device TD overlapping the display area DA of a display device 10.

Referring to FIG. 13, the base part 20 may include the first substrate SUB1 and the external signal lines OL. The external signal lines OL spaced apart from each other in the first direction DR1 may be disposed on the first substrate SUB1.

The conductive adhesive part 30 may be interposed between the base part 20 and the display device 10.

The display device 10 may include the second substrate SUB2, the display layer DPL, and the encapsulation layer TFE.

The second substrate SUB2 may be disposed on the first substrate SUB1 and the external signal lines OL with the conductive adhesive part 30 interposed between them.

The display layer DPL may be disposed on the second substrate SUB2. The display layer DPL may include the circuit layer TFTL, a light emitting element layer EML, a wavelength control layer WLCL, and a color filter layer CFL.

The circuit layer TFTL may be disposed on the second substrate SUB2. For example, the circuit layer TFTL may be disposed on the upper surface of the second substrate SUB2. The circuit layer TFTL may include at least one transistor for driving pixels to drive the light emitting element layer EML.

The circuit layer TFTL may include light blocking patterns BML, a buffer layer BF, transistors TFT, a gate insulating layer GI, an interlayer insulating film ILD, a first passivation layer PV1, and a first planarization layer OC1. Each of the transistors TFT may include an active layer ACT, a gate electrode GE, a first source or drain electrode SD1, and a second source or drain electrode SD2. As will be described later with reference to FIG. 15, the first connection patterns CWP and the connection lines CWL described above may be included in the circuit layer TFTL.

The light blocking patterns BML, may be disposed on the second substrate SUB2. Each of the light blocking patterns BML may be disposed under or below a transistor TFT to cover or overlap at least a channel region of the active layer ACT of the transistor TFT. The light blocking patterns BML may include a material that blocks light. For example, the light blocking patterns BML may be made of an opaque metal material that blocks transmission of light.

The buffer layer BF may be disposed on the light blocking patterns BML. The buffer layer BF may cover or overlap the entire surface of the second substrate SUB2 on which the light blocking patterns BML are disposed. The buffer layer BF may protect transistors from moisture introduced through the second substrate SUB2 which is vulnerable to moisture penetration.

A semiconductor layer is disposed on the buffer layer BF. The semiconductor layer may include the active layer ACT of each transistor TFT. The active layer ACT of each transistor TFT may overlap a light blocking pattern BML as described above.

The gate insulating layer GI may be disposed on the semiconductor layer. The gate insulating layer GI may be a multilayer in which inorganic layers including at least any one of inorganic materials such as silicon oxide (SiOx), silicon nitride (SiNx), and silicon oxynitride (SiOxNy) may be alternately stacked each other.

The gate electrode GE may be disposed on the gate insulating layer GI. The gate electrode GE may overlap the active layer ACT with the gate insulating layer GI interposed between them.

The interlayer insulating film ILD may be disposed on the gate electrode GE. The interlayer insulating film ILD may cover or overlap the gate electrode GE.

The first source or drain electrode SD1 and the second source or drain electrode SD2 may be disposed on the interlayer insulating film ILD and may be spaced apart from each other. The first and second source or drain electrodes SD1 and SD2 may respectively be electrically connected to both end regions of the active layer ACT of each transistor TFT through contact holes penetrating the interlayer insulating film ILD.

The second source or drain electrode SD2 may be electrically connected to a first voltage line. A high-potential voltage (or a first power supply voltage) supplied to a transistor TFT may be applied to the first voltage line. The first source or drain electrode SD1 may be electrically connected to a first electrode RME1 of the light emitting element layer EML which will be described later. The first source or drain electrode SD1 may be a source electrode of each transistor TFT, and the second source or drain electrode SD2 may be a drain electrode of each transistor TFT. However, the disclosure is not limited thereto. For example, the first source or drain electrode SD1 may be a drain electrode of each transistor TFT, and the second source or drain electrode SD2 may be a source electrode of each transistor TFT.

The first passivation layer PV1 may be disposed on the first source or drain electrode SD1 and the second source or drain electrode SD2. The first passivation layer PV1 may protect the transistors TFT. The first passivation layer PV1 may include a contact hole through which the first electrode RME1 passes.

The first planarization layer OC1 may be disposed on the first passivation layer PV1. The first planarization layer OC1 may have a substantially flat surface regardless of the shape or presence or absence of a pattern under or below the first planarization layer OC1. For example, the first planarization layer OC1 may planarize the top of the first passivation layer PV1. The first planarization layer OC1 may include a contact hole through which the first electrode RME1 of the light emitting element layer EML passes, together with the first passivation layer PV1. The first planarization layer OC1 may include an organic insulating material, for example, an organic material such as polyimide (PI).

The light emitting element layer EML may be disposed on the circuit layer TFTL. The light emitting element layer EML may be disposed on the first planarization layer OC1 of the circuit layer TFTL. The light emitting element layer EML may include protruding patterns BP, the first electrode RME1, a second electrode RME2, a first insulating layer PAS1, light emitting elements ED, a second insulating layer PAS2, a first contact electrode CTE1, a second contact electrode CTE2, and a sub-bank SB.

The protruding patterns BP may be disposed on the first planarization layer OC1 of the circuit layer TFTL. The protruding patterns BP may protrude from an upper surface of the first planarization layer OC1. The protruding patterns BP may be disposed in a light emitting area LA or opening area of each of the pixels. The protruding patterns BP may be spaced apart from each other in the light emitting area LA to provide a space in which light emitting elements ED are disposed.

The first electrode RME1 and the second electrode RME2 may be disposed on the protruding patterns BP and the first planarization layer OC1. The first electrode RME1 and the second electrode RME2 may be spaced apart from each other.

The first electrode RME1 may be disposed on a protruding pattern BP disposed on a side of light emitting elements ED. The first electrode RME1 may be disposed on inclined side surfaces of the protruding pattern BP to reflect light emitted from the light emitting elements ED. The first electrode RME1 may be electrically connected to the first source or drain electrode SD1 of each transistor TFT through a contact hole penetrating the first planarization layer OC1 and the first passivation layer PV1. The first electrode RME1 may be electrically connected to first ends of the light emitting elements ED through the first contact electrode CTE1.

The second electrode RME2 may be disposed on a protruding pattern BP disposed on the other side of the light emitting elements ED. The second electrode RME2 may be disposed on inclined side surfaces of the protruding pattern BP to reflect light emitted from the light emitting elements ED. The second electrode RME2 may be electrically connected to second ends of the light emitting elements ED through the second contact electrode CTE2. Although not illustrated in the drawing, the second electrode RME2 may be electrically connected to a second voltage line which applies a low-potential voltage. The second electrode RME2 may be electrically connected to the second voltage line to receive the low-potential voltage supplied to the second voltage line.

The first and second electrodes RME1 and RME2 may include a conductive material having high reflectivity. For example, the first and second electrodes RME1 and RME2 may include at least one of silver (Ag), copper (Cu), aluminum (Al), nickel (Ni), and lanthanum (La). For another example, the first and second electrodes RME1 and RME2 may include a material such as indium tin oxide (ITO), indium zinc oxide (IZO) or indium tin zinc oxide (ITZO). For another example, the first and second electrodes RME1 and RME2 may include layers having a transparent conductive material layer and a metal layer having high reflectivity or may include a single layer including a transparent conductive material and a metal having high reflectivity. The first and second electrodes RME1 and RME2 may have a stacked structure of ITO/Ag/ITO, ITO/Ag/IZO, or ITO/Ag/ITZO/IZO.

The first insulating layer PAS1 may be disposed on the first planarization layer OC1 and the first and second electrodes RME1 and RME2. The first insulating layer PAS1 may protect the first and second electrodes RME1 and RME2 while insulating the first and second electrodes RME1 and RME2 from each other. The first insulating layer PAS1 may include contact parts penetrating the first insulating layer PAS1 and partially exposing the first electrode RME1 and the second electrode RME2.

The sub-bank SB may be disposed on the first insulating layer PAS1 in the light blocking area BA. The sub-bank SB may be disposed at the boundaries of the pixels and may include openings overlapping the light exiting areas LA. The sub-bank SB may serve as a partition wall that guides ink, in which the light emitting elements ED are dispersed, to be sprayed into each light exiting area LA in an inkjet printing process for aligning the light emitting elements ED during a manufacturing process of the display device 10. The sub-bank SB may have a height and may include an organic insulating material such as polyimide (PI).

The light emitting elements ED may be disposed between the protruding patterns BP spaced apart from each other in each light exiting area LA. The light emitting elements ED may be disposed on the first insulating layer PAS1. The light emitting elements ED may be aligned such that both ends thereof lie on the first electrode RME1 and the second electrode RME2, respectively.

The first ends of the light emitting elements ED may be electrically connected to the first electrode RME1 through the first contact electrode CTE1, and the second ends of the light emitting elements ED may be electrically connected to the second electrode RME2 through the second contact electrode CTE2.

Each of the light emitting elements ED may have a nanometer-scale size (in a range of about 1 nm to less than about 1 μm) to a micrometer-scale size (in a range of about 1 μm to less than about 1 mm). In an embodiment, both a diameter and a length of each light emitting element ED may have a nanometer-scale size or a micrometer-scale size. In an embodiment, the diameter of each light emitting element ED may have a nanometer-scale size, whereas the length of each light emitting element ED has a micrometer-scale size. In an embodiment, some or a number of the light emitting elements ED may have a nanometer-scale size in diameter and/or length, whereas the other ones of the light emitting elements ED have a micrometer-scale size in diameter and/or length.

In an embodiment, each of the light emitting elements ED may be an inorganic light emitting diode. The inorganic light emitting diode may include semiconductor layers. For example, the inorganic light emitting diode may include a first conductivity type (for example, n-type) semiconductor layer, a second conductivity type (for example, p-type) semiconductor layer, and an active semiconductor layer interposed between them. The active semiconductor layer may receive holes and electrons respectively from the first conductivity type semiconductor layer and the second conductivity type semiconductor layer, and the holes and the electrons reaching the active semiconductor layer may combine together to emit light. The light emitting elements ED may be aligned between the first and second electrodes RME1 and RME2 according to an electric field formed in a specific or given direction between the first and second electrodes RME1 and RME2 spaced apart to face each other.

The light emitting elements ED disposed in each of the first through third light exiting areas LA1 through LA3 may include active layers having a same material or a similar material to emit light of the same wavelength band or light of the same color. For example, the light emitting elements ED may emit light of the third color or blue light having a peak wavelength in a range of about 440 to about 480 nm, but the disclosure is not limited thereto.

The second insulating layer PAS2 may be disposed on the light emitting elements ED. For example, the second insulating layer PAS2 may surround an outer surface of each of the light emitting elements ED but may expose both ends of each of the light emitting elements ED. The second insulating layer PAS2 may protect the light emitting elements ED while fixing the light emitting elements ED in the manufacturing process of the display device 10. The second insulating layer PAS2 may fill a space between each light emitting element ED and the first insulating layer PAS1.

The first contact electrode CTE1 may be disposed on the first electrode RME1 and the first insulating layer PAS1. The first contact electrode CTE1 may be electrically connected to the first electrode RME1 through a contact part penetrating the first insulating layer PAS1 and exposing a part of the first electrode RME1. The first contact electrode CTE1 may contact the first ends of the light emitting elements ED exposed by the second insulating layer PAS2. Since the first contact electrode CTE1 contacts both the first electrode RME1 and the first ends of the light emitting elements ED, it may electrically connect the first electrode RME1 and the first ends of the light emitting elements ED.

The second contact electrode CTE2 may be disposed on the second electrode RME2 and the first insulating layer PAS1. The second contact electrode CTE2 may be spaced apart from the first contact electrode CTE1. The second contact electrode CTE2 may be electrically connected to the second electrode RME2 through a contact part penetrating the first insulating layer PAS1 and exposing a part of the second electrode RME2. The second contact electrode CTE2 may contact the second ends of the light emitting elements ED exposed by the second insulating layer PAS2. Since the second contact electrode CTE2 contacts both the second electrode RME2 and the second ends of the light emitting elements ED, it may electrically connect the second electrode RME2 and the second ends of the light emitting elements ED.

The wavelength control layer WLCL may be disposed on the light emitting element layer EML. The wavelength control layer WLCL may convert or transmit the wavelength of light incident on the wavelength control layer WLCL after being emitted from the light emitting element layer EML, so that the wavelength of the light corresponds to a color corresponding to each pixel.

The wavelength control layer WLCL may include a capping layer PAS3, a first light blocking member BK1, a first wavelength conversion pattern WLC1, a second wavelength conversion pattern WLC2, a light transmission pattern LTU, a second passivation layer PV2, and a second planarization layer OC2.

The capping layer PAS3 may be disposed on the light emitting element layer EML. The capping layer PAS3 may cover or overlap the top of the light emitting element layer EML and may seal lower surfaces of the first wavelength conversion pattern WLC1, the second wavelength conversion pattern WLC2, and the light transmission pattern LTU. For example, the capping layer PAS3 may include an inorganic material.

The first light blocking member BK1 may be disposed on the capping layer PAS3 in the light blocking area BA. The first light blocking member BK1 may overlap the sub-bank SB in the thickness direction. The first light blocking member BK1 may block transmission of light. The first light blocking member BK1 may prevent color mixing by preventing intrusion of light between the first through third light exiting areas LA1 through LA3, thereby improving a color gamut of the tiled display device TD. The first light blocking member BK1 may surround the first through third light exiting areas LA1 through LA3 in a plan view.

The first wavelength conversion pattern WLC1 may be disposed on the capping layer PAS3 in the first light exiting area LA1. The first wavelength conversion pattern WLC1 may be surrounded by the first light blocking member BK1. The first wavelength conversion pattern WLC1 may include a first base resin BS1, first scatterers SCT1, and first wavelength conversion particles WLS1.

The first base resin BS1 may include a material having a relatively high light transmittance. The first base resin BS1 may be made of a transparent organic material. For example, the first base resin BS1 may include at least one of organic materials such as epoxy resin, acrylic resin, cardo resin, and imide resin.

The first scatterers SCT1 may have a refractive index different from that of the first base resin BS1 and may form an optical interface with the first base resin BS1. For example, the first scatterers SCT1 may include a light scattering material or light scattering particles that scatter at least a part of transmitted light. For example, the first scatterers SCT1 may include metal oxide such as titanium oxide (TiO2), zirconium oxide (ZrO2), aluminum oxide (Al2O3), indium oxide (In2O3), zinc oxide (ZnO) or tin oxide (SnO2) or may include organic particles such as acrylic resin or urethane resin. The first scatterers SCT1 may scatter incident light in random directions regardless of the incident direction of the incident light without substantially converting the peak wavelength of the incident light.

The first wavelength conversion particles WLS1 may convert or shift the peak wavelength of incident light into a first peak wavelength. For example, the first wavelength conversion particles WLS1 may convert blue light provided by the display device 10 into red light having a single peak wavelength of 610 to 650 nm and emit the red light. The first wavelength conversion particles WLS1 may be quantum dots, quantum rods, or phosphors. The quantum dots may be particulate materials that emit light of a specific or given color in case that electrons transition from a conduction band to a valence band.

The second wavelength conversion pattern WLC2 may be disposed on the capping layer PAS3 in the second light exiting area LA2. The second wavelength conversion pattern WLC2 may be surrounded by the first light blocking member BK1. The second wavelength conversion pattern WLC2 may include a second base resin BS2, second scatterers SCT2, and second wavelength conversion materials WLS2.

The second base resin BS2 may include a material having a relatively high light transmittance. The second base resin BS2 may be made of a transparent organic material. For example, the second base resin BS2 may be made of a same material or a similar material as the first base resin BS1 or may be made of any of the materials in the description of the first base resin BS1.

The second scatterers SCT2 may have a refractive index different from that of the second base resin BS2 and may form an optical interface with the second base resin BS2. For example, the second scatterers SCT2 may include a light scattering material or light scattering particles that scatter at least a part of transmitted light. For example, the second scatterers SCT2 may be made of a same material or a similar material as the first scatterers SCT1 or may be made of any of the materials in the description of the first scatterers SCT1. The second scatterers SCT2 may scatter incident light in random directions regardless of the incident direction of the incident light without substantially converting the peak wavelength of the incident light.

The second wavelength conversion materials WLS2 may convert or shift the peak wavelength of incident light into a second peak wavelength different from the first peak wavelength of the first wavelength conversion materials WLS1. For example, the second wavelength conversion materials WLS2 may convert blue light provided by the display device 10 into green light having a single peak wavelength of 510 to 550 nm and emit the green light. The second wavelength conversion materials WLS2 may be quantum dots, quantum rods, or phosphors. The second wavelength conversion materials WLS2 may be made of quantum dots, quantum rods, or phosphors such that their wavelength conversion range is different from the wavelength conversion range of the first wavelength conversion materials WLS1.

The light transmission pattern LTU may be disposed on the capping layer PAS3 in the third light exiting area LA3. The light transmission pattern LTU may be surrounded by the first light blocking member BK1. The light transmission pattern LTU may transmit incident light while maintaining the peak wavelength of the incident light. The light transmission pattern LTU may include a third base resin BS3 and third scatterers SCT3.

The third base resin BS3 may include a material having a relatively high light transmittance. The third base resin BS3 may be made of a transparent organic material. For example, the third base resin BS3 may be made of a same material or a similar material as the first or second base resin BS1 or BS2 or may be made of any of the materials in the description of the first or second base resin BS1 or BA2.

The third scatterers SCT3 may have a refractive index different from that of the third base resin BS3 and may form an optical interface with the third base resin BS3. For example, the third scatterers SCT3 may include a light scattering material or light scattering particles that scatter at least a part of transmitted light. For example, the third scatterers SCT3 may be made of a same material or a similar material as the first or second scatterers SCT1 or SCT2 or may be made of any of the materials in the description of the first or second scatterers SCT1 or SCT2. The third scatterers SCT3 may scatter incident light in random directions regardless of the incident direction of the incident light without substantially converting the peak wavelength of the incident light.

The second passivation layer PV2 may cover or overlap the first wavelength conversion pattern WLC1, the second wavelength conversion pattern WLC2, the light transmission pattern LTU, and the first light blocking member BK1. For example, the second passivation layer PV2 may prevent damage to or contamination of the first and second wavelength conversion patterns WLC1 and WLC2 and the light transmission pattern LTU by sealing the first wavelength conversion pattern WLC1, the second wavelength conversion pattern WLC2 and the light transmission pattern LTU. For example, the second passivation layer PV2 may include an inorganic material.

The second planarization layer OC2 may be disposed on the second passivation layer PV2. The second planarization layer OC2 may have a substantially flat surface regardless of the shape or presence or absence of the first wavelength conversion pattern WLC1, the second wavelength conversion pattern WLC2 and the light transmission pattern LTU disposed under or below the second planarization layer OC2. For example, the second planarization layer OC2 may planarize the top of the first wavelength conversion pattern WLC1, the second wavelength conversion pattern WLC2, and the light transmission pattern LTU. For example, the second planarization layer OC2 may include an organic insulating material such as polyimide (PI).

Since the wavelength control layer WLCL may be disposed on or directly disposed on the light emitting element layer EML, the display device 10 may not require a separate substrate or base part for the first and second wavelength conversion patterns WLC1 and WLC2 and the light transmission pattern LTU. Therefore, the first and second wavelength conversion patterns WLC1 and WLC2 and the light transmission pattern LTU can be readily aligned in the first through third light exiting areas LA1 through LA3, respectively, and the thickness of the display device 10 can be relatively reduced.

The color filter layer CFL may be disposed on the wavelength control layer WLCL. The color filter layer CFL may block light of a color other than the color corresponding to each pixel from being emitted.

The color filter layer CFL may be disposed on the second planarization layer OC2 of the wavelength control layer WLCL. The color filter layer CFL may include a second light blocking member BK2, first through third color filters CF1 through CF3, and a third passivation layer PV3.

The second light blocking member BK2 may be disposed on the second planarization layer OC2 of the wavelength control layer WLCL in the light blocking area BA. The second light blocking member BK2 may overlap the first light blocking member BK1 or the sub-bank SB in the thickness direction. The second light blocking member BK2 may block transmission of light. The second light blocking member BK2 may prevent color mixing by preventing intrusion of light between the first through third light exiting areas LA1 through LA3, thereby improving the color gamut of the tiled display device TD. The second light blocking member BK2 may surround the first through third light exiting areas LA1 through LA3 in a plan view.

The first color filter CF1 may be disposed on the second planarization layer OC2 in the first light exiting area LA1.

The first color filter CF1 may be surrounded by the second light blocking member BK2. The first color filter CF1 may overlap the first wavelength conversion pattern WLC1 in the thickness direction. The first color filter CF1 may selectively transmit light of the first color (for example, red light) and block or absorb light of the second color (for example, green light) and light of the third color (for example, blue light). For example, the first color filter CF1 may be a red color filter and may include a red colorant.

The second color filter CF2 may be disposed on the second planarization layer OC2 in the second light exiting area LA2. The second color filter CF2 may be surrounded by the second light blocking member BK2. The second color filter CF2 may overlap the second wavelength conversion pattern WLC2 in the thickness direction. The second color filter CF2 may selectively transmit light of the second color (for example, green light) and block or absorb light of the first color (for example, red light) and light of the third color (for example, blue light). For example, the second color filter CF2 may be a green color filter and may include a green colorant.

The third color filter CF3 may be disposed on the second planarization layer OC2 in the third light exiting area LA3. The third color filter CF3 may be surrounded by the second light blocking member BK2. The third color filter CF3 may overlap the light transmission pattern LTU in the thickness direction. The third color filter CF3 may selectively transmit light of the third color (for example, blue light) and block or absorb light of the first color (for example, red light) and light of the second color (for example, green light). For example, the third color filter CF3 may be a blue color filter and may include a blue colorant.

The first through third color filters CF1 through CF3 may absorb a part of light coming from the outside of the display device 10, thereby reducing reflected light due to the external light. Therefore, the first through third color filters CF1 through CF3 may prevent color distortion due to reflection of external light.

Since the first through third color filters CF1 through CF3 may be disposed on or directly disposed on the second planarization layer OC2 of the wavelength control layer WLCL, the display device 10 may not require a separate substrate for the first through third color filters CF1 through CF3. Therefore, the thickness of the display device 10 can be relatively reduced.

The third passivation layer PV3 may cover or overlap the first through third color filters CF1 through CF3. The third passivation layer PV3 may protect the first through third color filters CF1 through CF3.

The encapsulation layer TFE may be disposed on the third passivation layer PV3 of the color filter layer CFL. The encapsulation layer TFE may include at least one inorganic layer to prevent penetration of oxygen or moisture. The encapsulation layer TFE may include at least one organic layer to protect the display device 10 from foreign substances such as dust.

Figure 14:
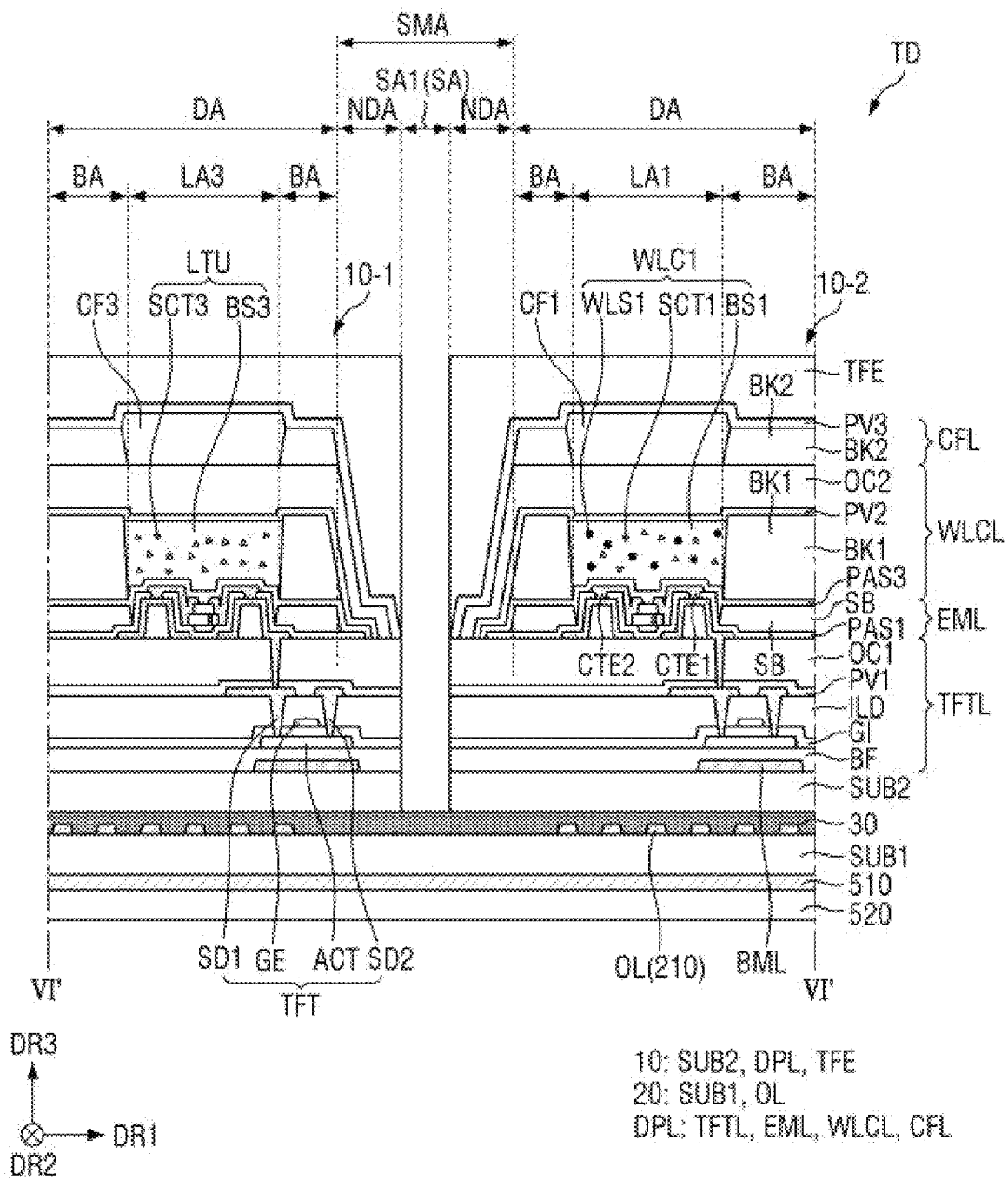
FIG. 14 is a schematic cross-sectional view of an example of the tiled display device taken along line VI-VI' of FIG. 1.

FIG. 14 is a schematic cross-sectional view of an example of the tiled display device TD taken along line VI-VI' of FIG. 1. FIG. 14 illustrates the cross-sectional structure of display devices 10 disposed adjacent to each other in the first direction DR1, for example, illustrates a part of the cross-sectional structure of a first display device 10-1 and a second display device 10-2.

Referring to FIG. 14, the second substrate SUB2 of each of the display devices 10-1 and 10-2 may be formed to protrude further outward than the color filter layer CFL or the wavelength control layer WLCL of the display layer DPL. This may be intended to prevent the first and second light blocking members BK1 and BK2 of the color filter layer CFL or the wavelength control layer WLCL disposed adjacent to the non-display area NDA from being damaged in a process of cutting the outside of each display device 10 during a manufacturing process of the display devices 10. Therefore, the first and second light blocking members BK1 and BK2 may not be disposed in the boundary area SMA.

As described above, the conductive adhesive part 30 electrically connecting the base part 20 and the display devices 10 may include a black material. For example, the conductive adhesive part 30 may be an anisotropic conductive film including an opaque material that blocks transmission of light. Although the conductive adhesive part 30 is formed as an integrated layer including a same material or a similar material in the drawing, the disclosure is not limited thereto. For example, the conductive adhesive part 30 may include a black anisotropic conductive film in an area overlapping the display devices 10 and the external signal lines OL (210) and may include a black double-sided tape or resin in an area not overlapping the display devices 10 or the external signal lines OL (210).

In the current embodiment, the first and second light blocking members BK1 and BK2 are not disposed in the boundary area SMA including the first separation area SA1 as well as the non-display areas NDA of the display devices 10. Nonetheless, since the conductive adhesive part 30 may include a light blocking material, it is possible to prevent external light from being reflected and thus seen by a user in the boundary area SMA.

Figure 15:
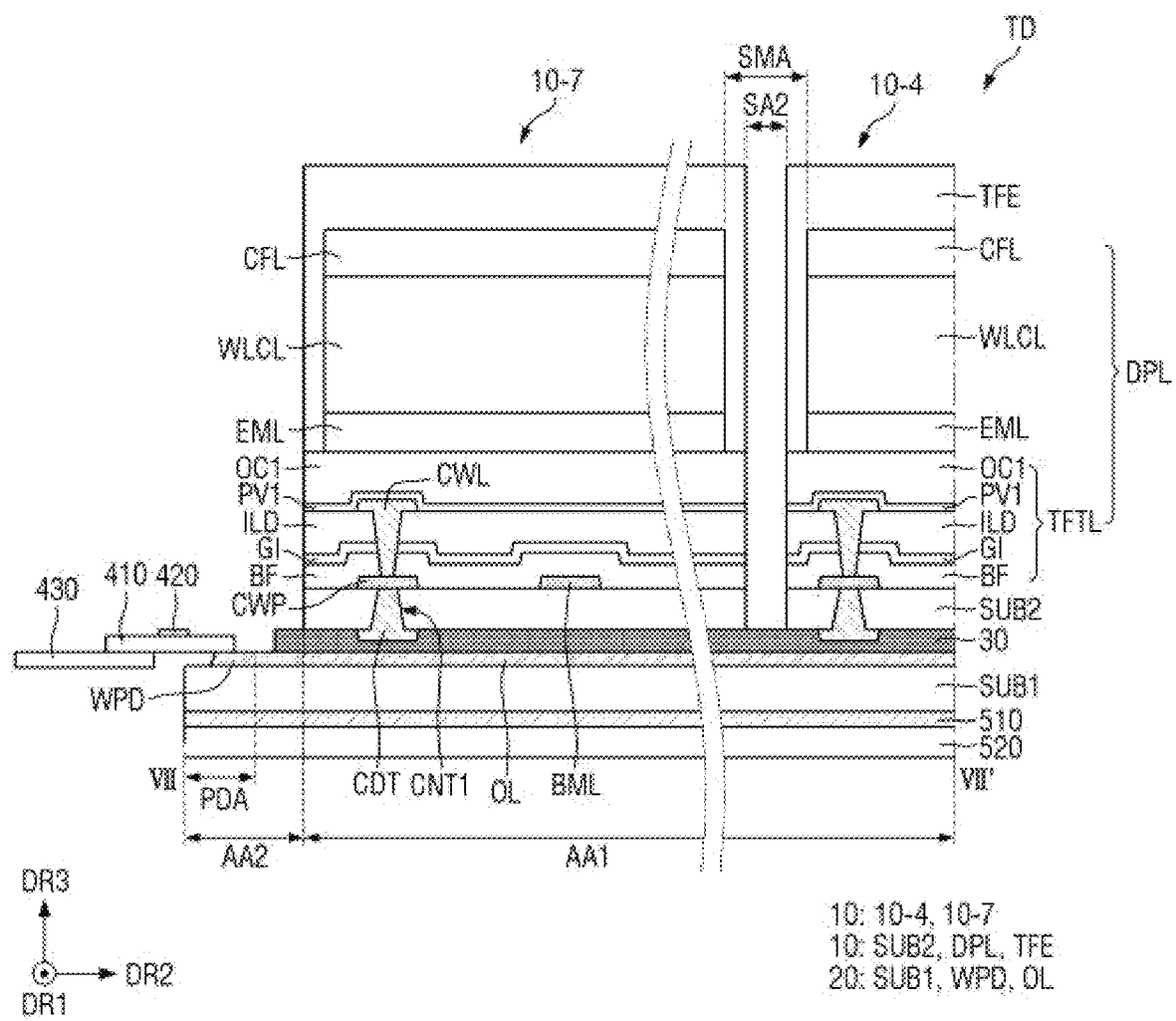
FIG. 15 is a schematic cross-sectional view of the tiled display device taken along line VII-VII' of FIG. 12.

FIG. 15 is a schematic cross-sectional view of the tiled display device TD taken along line VII-VII' of FIG. 12. FIG. 15 illustrates the cross-sectional structure of display devices 10 disposed adjacent to each other in the second direction DR2, for example, illustrates a part of the cross-sectional structure of a third display device 10-7 and a fourth display device 10-4.

Referring to FIG. 15, a second connection pattern CDT may receive an electrical signal, which is transmitted from a flexible film 410 to a pad part WPD of the base part 20, through an external signal line OL. The second connection pattern CDT may be inserted into a contact hole CNT1 penetrating the second substrate SUB2 and thus may be electrically connected to a first connection pattern CWP. The second connection pattern CDT may transmit the electrical signal received from the external signal line OL to the first connection pattern CWP.

For example, the first connection pattern CWP of display device 10 may be exposed on the lower surface of the display layer DPL. The first connection pattern CWP exposed on the lower surface of the display layer DPL may be electrically connected to the second connection pattern CDT through the contact hole CNT1 penetrating the second substrate SUB2. For example, a lower width of the contact hole CNT1 may be greater than an upper width of the contact hole CNT1.

The first connection pattern CWP may be spaced apart from a light blocking pattern BML on the second substrate SUB2. The first connection pattern CWP may be formed on a same layer as the light blocking pattern BML. The first connection pattern CWP may include a same material or a similar material as the light blocking pattern BML. However, the disclosure is not limited thereto, and the first connection pattern CWP may also not be formed on a same layer as the light blocking pattern BML or may include a different material from the light blocking pattern BML.

A connection line CWL may be disposed on the first connection pattern CWP. In an embodiment, the connection line CWL may be disposed on the interlayer insulating film ILD. The connection line CWL may be electrically connected to the first connection pattern CWP through a contact hole penetrating the interlayer insulating film ILD, the gate insulating layer GI, and the buffer layer BF. The connection line CWL may be connected to lines (for example, the data lines DTL, the first and second voltage lines VL1 and VL2, and the first and second scan lines SL1 and SL2) disposed in the circuit layer TFTL of the display device 10 as described above and may supply a signal and power received through the first connection pattern CWP to the lines (for example, the data lines DTL, the first and second voltage lines VL1 and VL2, and the first and second scan lines SL1 and SL2).

The pad part WPD may be disposed on the upper surface of the first substrate SUB1 of the base part 20. The pad part WPD may receive various voltages or signals from the flexible film 410 as described above and may supply the voltages or signals to the external signal line OL.

The external signal line OL may supply the above voltages or signals to the second connection pattern CDT of the display device 10 through the conductive adhesive part 30. The second connection pattern CDT may be electrically connected to the first connection pattern CWP through the contact hole CNT1 penetrating the second substrate SUB2 to supply the electrical signal to the connection line CWL. The electrical signal supplied to the connection line CWL may be transmitted to lines of the display device 10 which correspond to the connection line CWL. Therefore, an individual pad part may be omitted from the display device 10 included in the tiled display device TD according to the current embodiment, and the display device 10 may receive a display driving signal through the pad part WPD disposed on a side of the base part 20. Accordingly, since the pad part is omitted from each of display devices 10, restrictions on the arrangement and number of display devices 10 can be minimized.

The external signal line OL may extend in the second direction DR2 and may also be disposed in the second separation area SA2 between the third display device 10-7 and the fourth display device 10-4 aligned side by side in the second direction DR2. The conductive adhesive part 30 may be disposed on the external signal line OL to completely cover or overlap the external signal line OL. Therefore, the conductive adhesive part 30 may cover or overlap the external signal line OL overlapping the second separation area SA2.

In the current embodiment, the first and second light blocking members BK1 and BK2 are not disposed in the boundary area SMA including the non-display areas NDA of the display devices 10 and the second separation area SA2. Nonetheless, since the conductive adhesive part 30 may include a light blocking material, it is possible to prevent external signal lines OL disposed in the boundary area SMA from being seen by a user.

Figure 16:
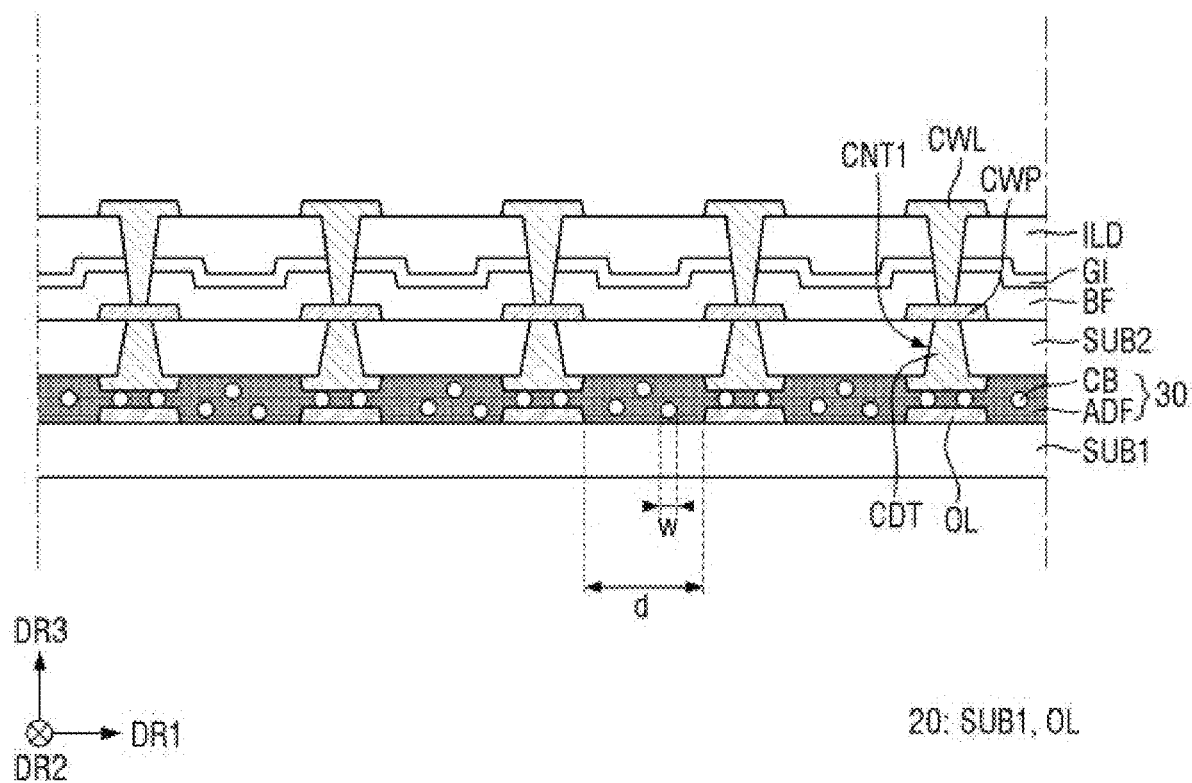
FIG. 16 is a schematic cross-sectional view illustrating an electrical connection relationship between external signal lines of the base part and connection lines of a display device according to an embodiment.

FIG. 16 is a schematic cross-sectional view illustrating an electrical connection relationship between the external signal lines OL of the base part 20 and the connection lines CWL of a display device 10 according to an embodiment.

Referring to FIG. 16, as described above, the conductive adhesive part 30 may include an anisotropic conductive film. The conductive adhesive part 30 may include an adhesive layer ADF and conductive balls CB located in the adhesive layer ADF.

The adhesive layer ADF may be interposed between the first substrate SUB1 and the second substrate SUB2 to bond the first substrate SUB1 and the second substrate SUB2 together. The adhesive layer ADF may cover or overlap the external signal lines OL disposed on the first substrate SUB1 and cover or overlap the second connection patterns CDT formed on the second substrate SUB2.

The adhesive layer ADF may include an adhesive material that can bond the first substrate SUB1 and the second substrate SUB2 together. The adhesive layer ADF may include an insulating material. The adhesive layer ADF may include a light blocking material. In an embodiment, the adhesive layer ADF may include a material having adhesive and insulating properties and blocking light. For example, the adhesive layer ADF may include, but is not limited to, at least any one of epoxy resin, acrylic resin, and polyester resin containing a black pigment.

The conductive balls CB may include a spherical shape, but the disclosure is not limited thereto. In case that the conductive balls CB include a spherical shape, they may be formed by coating spherical polymers with at least any one of metals such as nickel (Ni), cobalt (Co), gold (Au), silver (Ag), and copper (Cu). The conductive balls CB may be disposed between the external signal lines OL and the second connection patterns CDT and may electrically connect the external signal lines OL and the second connection patterns CDT. In cross section of the tiled display device TD, a side of the conductive balls CB may contact or directly contact the external signal lines OL, and the other side of the conductive balls CB may contact or directly contact the second connection patterns CDT. In case that the conductive adhesive part 30 is an anisotropic conductive film, the base part 20 and the display device 10 may be bonded together by applying heat or pressure to the conductive adhesive part 30.

A diameter W of each conductive ball CB may be smaller than a distance d between the external signal lines OL. Therefore, even though the conductive adhesive part 30 is entirely disposed between the display device 10 and the base part 20, a short circuit may not occur between the external signal lines OL.

Figure 17:
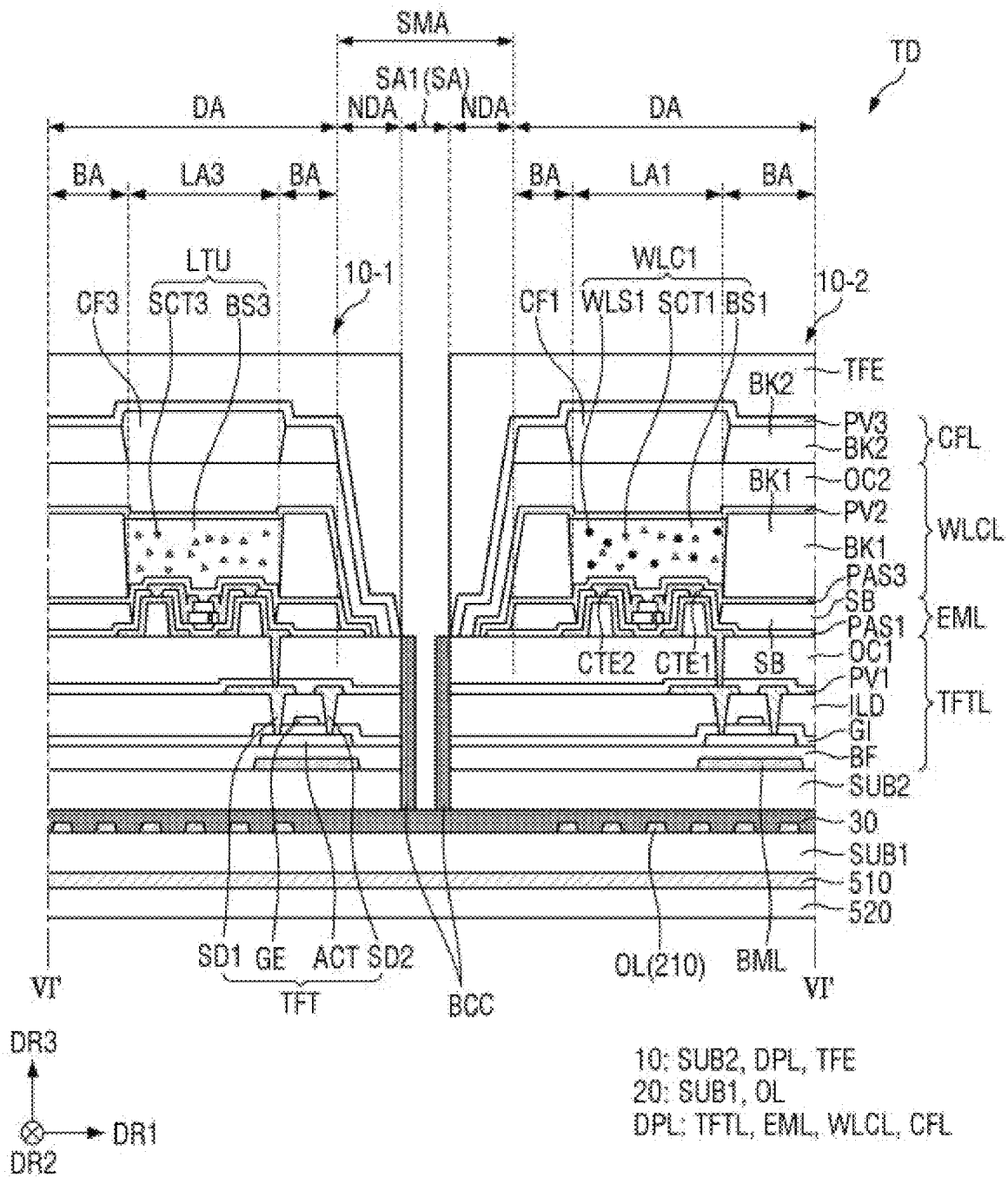
FIG. 17 is a schematic cross-sectional view of an example of the tiled display device taken along line VI-VI' of FIG. 1.

FIG. 17 is a schematic cross-sectional view of an example of the tiled display device TD taken along line VI-VI' of FIG. 1.

Referring to FIG. 17, a tiled display device TD according to an embodiment may be different from an embodiment of FIG. 14 in that it further may include a first light blocking coating layer BCC.

For example, the tiled display device TD may further include the first light blocking coating layer BCC disposed in a boundary area SMA. The first light blocking coating layer BCC may be disposed on side surfaces of second substrates SUB2 and circuit layers TFTL of display devices 10 in a separation area SA between the display devices 10 spaced apart to face each other. The first light blocking coating layer BCC may include a light blocking material. In the current embodiment, since the tiled display device TD further may include the first light blocking coating layer BCC disposed in the boundary area SMA, the boundary area SMA can be more readily prevented from being seen by a user.

Figure 18:
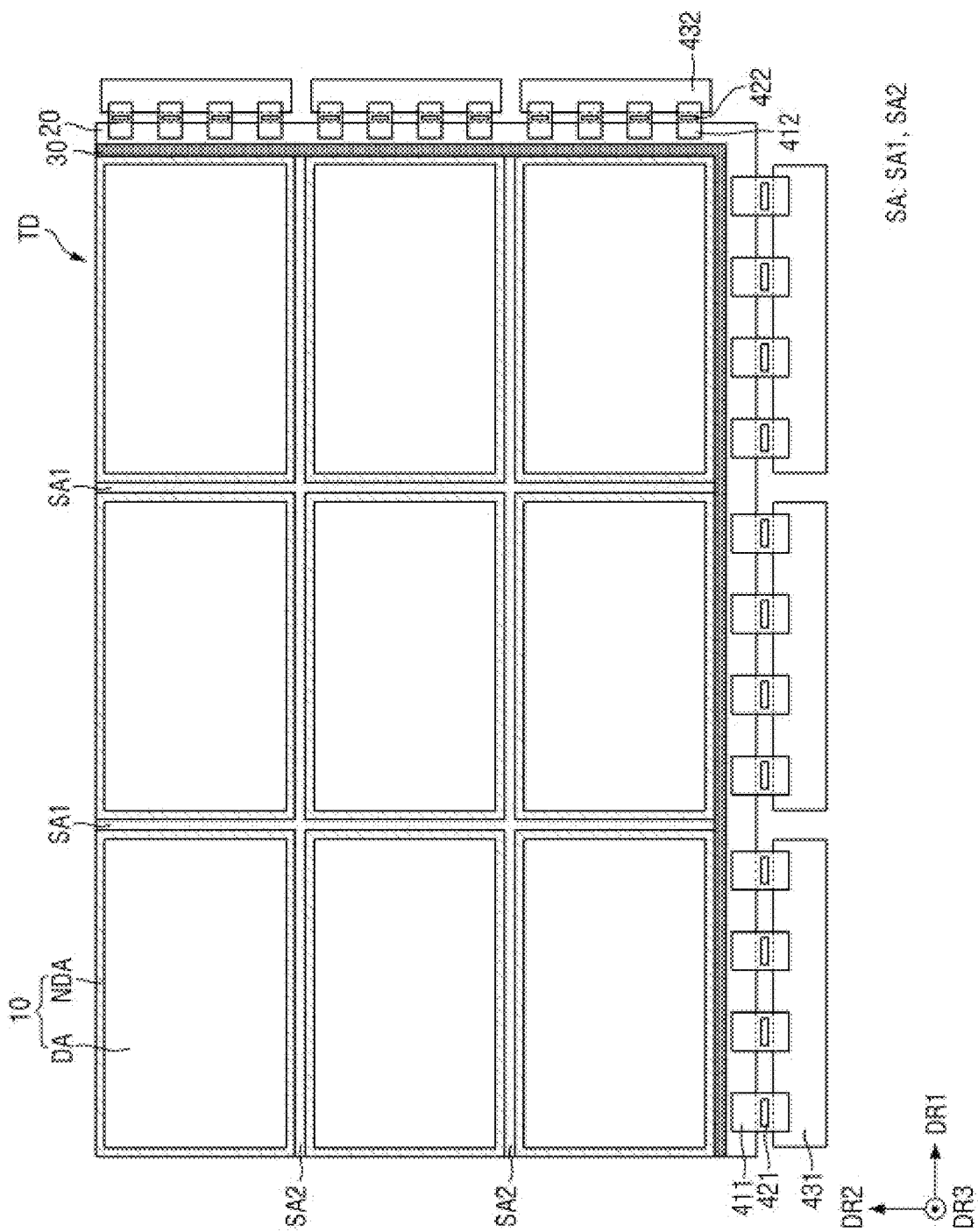
FIG. 18 is a schematic plan view of a tiled display device according to an embodiment.

FIG. 18 is a schematic plan view of a tiled display device TD according to an embodiment.

Referring to FIG. 18, the tiled display device TD according to an embodiment may be different from an embodiment of FIG. 1 in that flexible films and circuit boards are disposed in each of a peripheral area on a lower side of a base part 20 and a peripheral area on a right side of the base part 20.

For example, the tiled display device TD according to the current embodiment may include first flexible films 411 and second flexible films 412, include first circuit boards 431 and second circuit boards 432, and include first display drivers 421 and second display drivers 422.

The arrangement of the first flexible films 411, the first circuit boards 431, and the first display drivers 421 may be substantially the same as the arrangement of the flexible films 410, the circuit boards 430, and the display drivers 420 described above with reference to FIG. 1. Therefore, this will not be described in detail.

The second flexible films 412 may be attached to pad parts (not illustrated) located in the peripheral area on the right side of the base part 20. The second flexible films 412 may be located in a direction perpendicular to the first flexible films 411. Input terminals provided on a side of the second flexible films 412 may be attached to the second circuit boards 432 by a film attaching process, and output terminals provided on the other side of the second flexile films 412 may be attached to the pad parts of the base part 20 by a film attaching process. The second display drivers 422 may be mounted on the second flexible films 412 and may include a scan driver which supplies scan signals to scan lines SL1 and SL2 of display devices 10. The first display drivers 421 may not include the scan driver.

Figure 19:
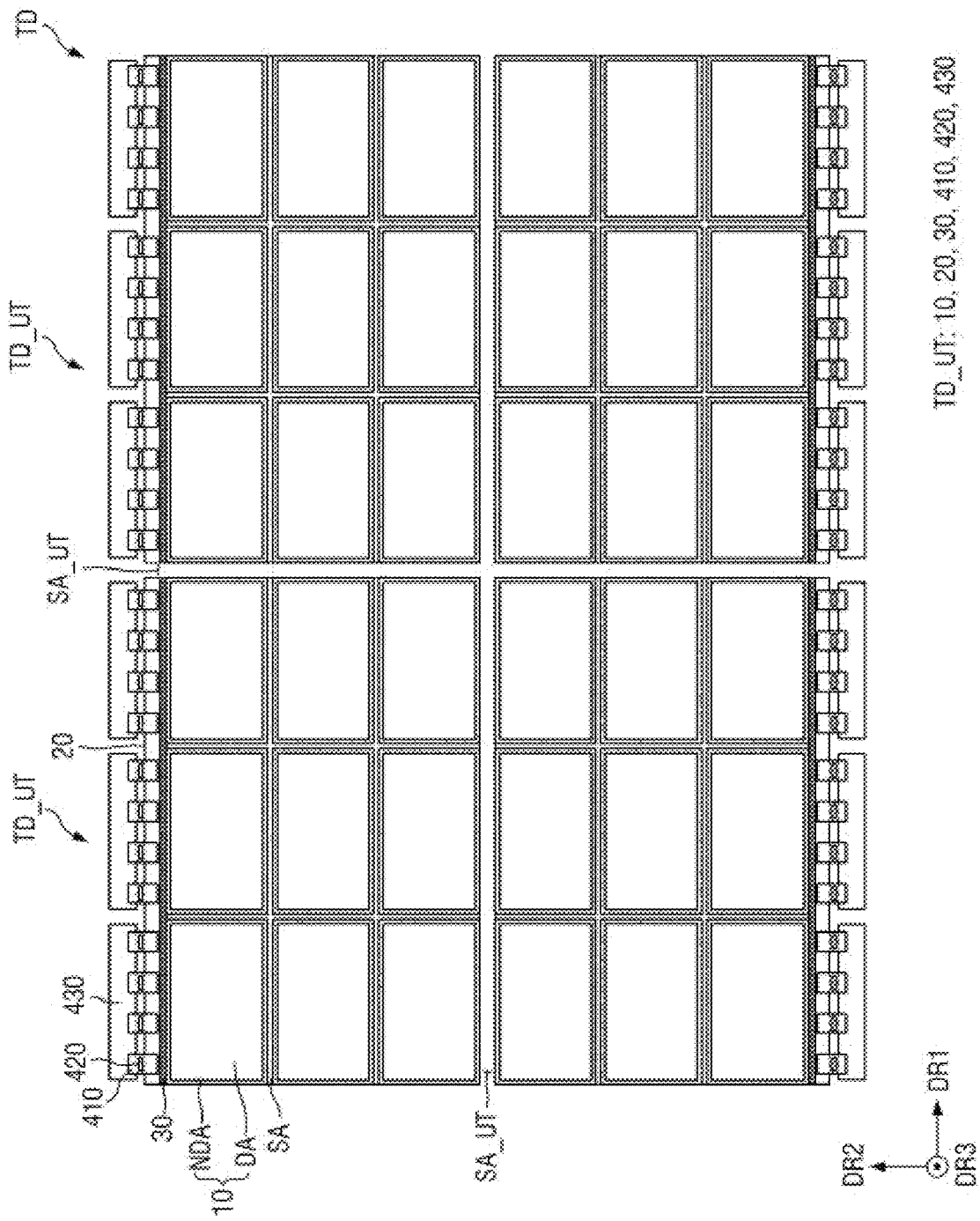
FIG. 19 is a schematic plan view of a tiled display device according to an embodiment.

FIG. 19 is a schematic plan view of a tiled display device TD according to an embodiment.

Referring to FIG. 19, the tiled display device TD according to the current embodiment may include tiled display units or tiled displays TD_UT. Each of the tiled display units TD_UT may be substantially the same as the tiled display device TD described above with reference to FIG. 1. For example, each of the tiled display units TD_UT may include display devices 10, a base part 20, a conductive adhesive part 30, flexible films 410, display drivers 420, and circuit boards 430. The tiled display units TD_UT may not include a bottom plate 520 and a heat dissipation part 510.

The tiled display units TD_UT may be arranged in a matrix shape. The tiled display units TD_UT may be spaced apart from each other by a distance. Therefore, a separation area SA_UT may be formed between the tiled display units TD_UT. In an embodiment, the tiled display units TD_UT may be arranged in a 2×2 matrix shape. The flexible films 410, the display drivers 420, and the circuit boards 430 disposed on a side of each tiled display unit TD_UT may be disposed to face outward from the tiled display device TD. Therefore, the flexible films 410, the display drivers 420, and the circuit boards 430 of tiled display units TD_UT disposed in a first row may be disposed on upper sides of the tiled display units TD_UT, and the flexible films 410, the display drivers 420, and the circuit boards 430 of tiled display units TD_UT disposed in a second row may be disposed to face lower sides of the tiled display units TD_UT. Since the flexible films 410, the display drivers 420, and the circuit boards 430 of each tiled display unit TD_UT are not disposed in the separation area SA_UT between the tiled display units TD_UT, a width of the separation area SA_UT between the tiled display units TD_UT can be minimized. Therefore, the separation area SA_UT can be prevented from being recognized by a user.

Figure 20:
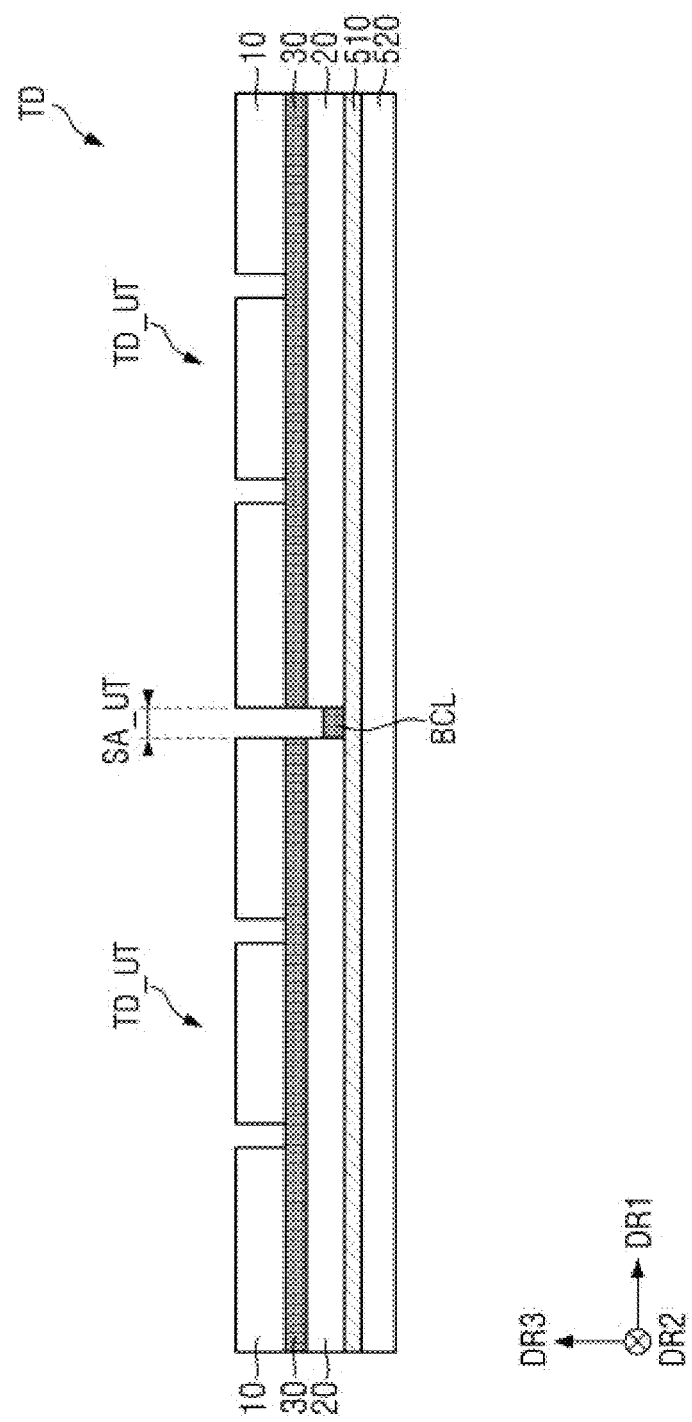
FIG. 20 is a schematic cross-sectional view of an example of the tiled display device of FIG. 19, taken along a long side direction of the tiled display device.
Figure 21:
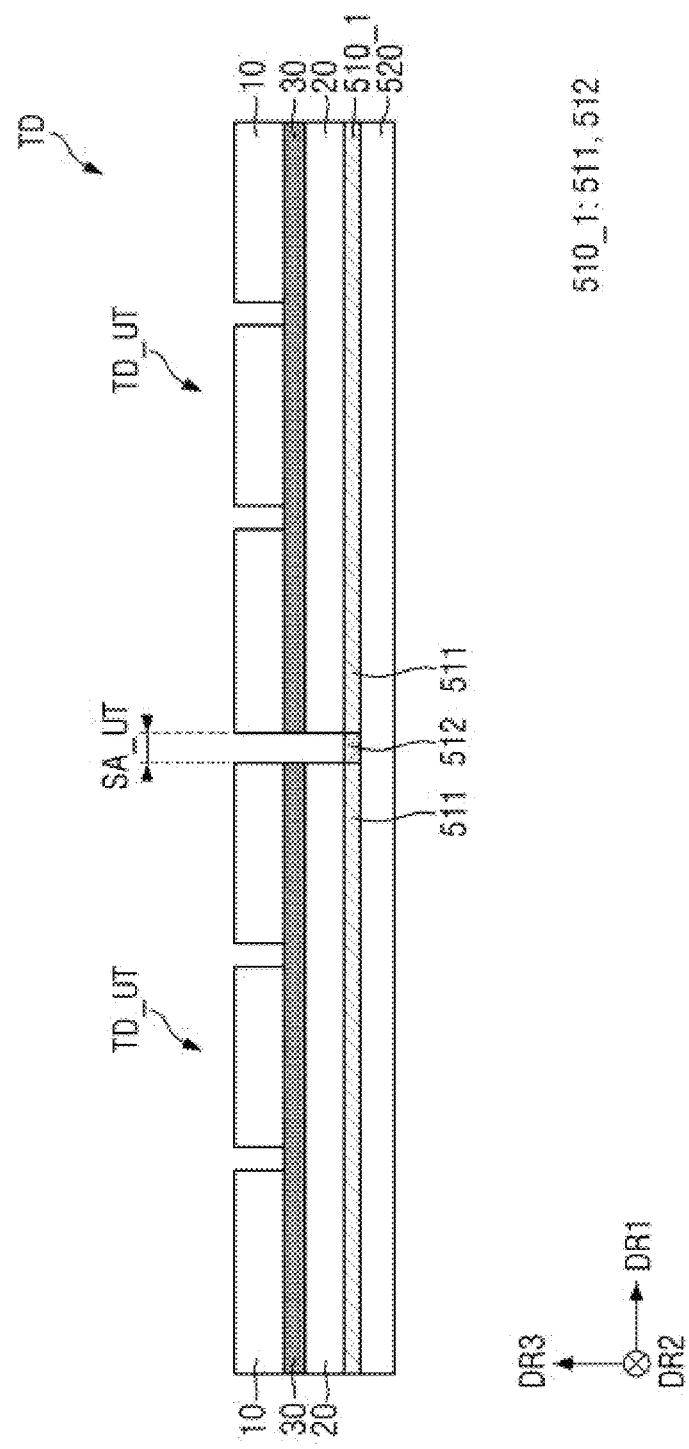
FIG. 21 is a schematic cross-sectional view of an example of the tiled display device of FIG. 19, taken along the long side direction of the tiled display device.
Figure 22:
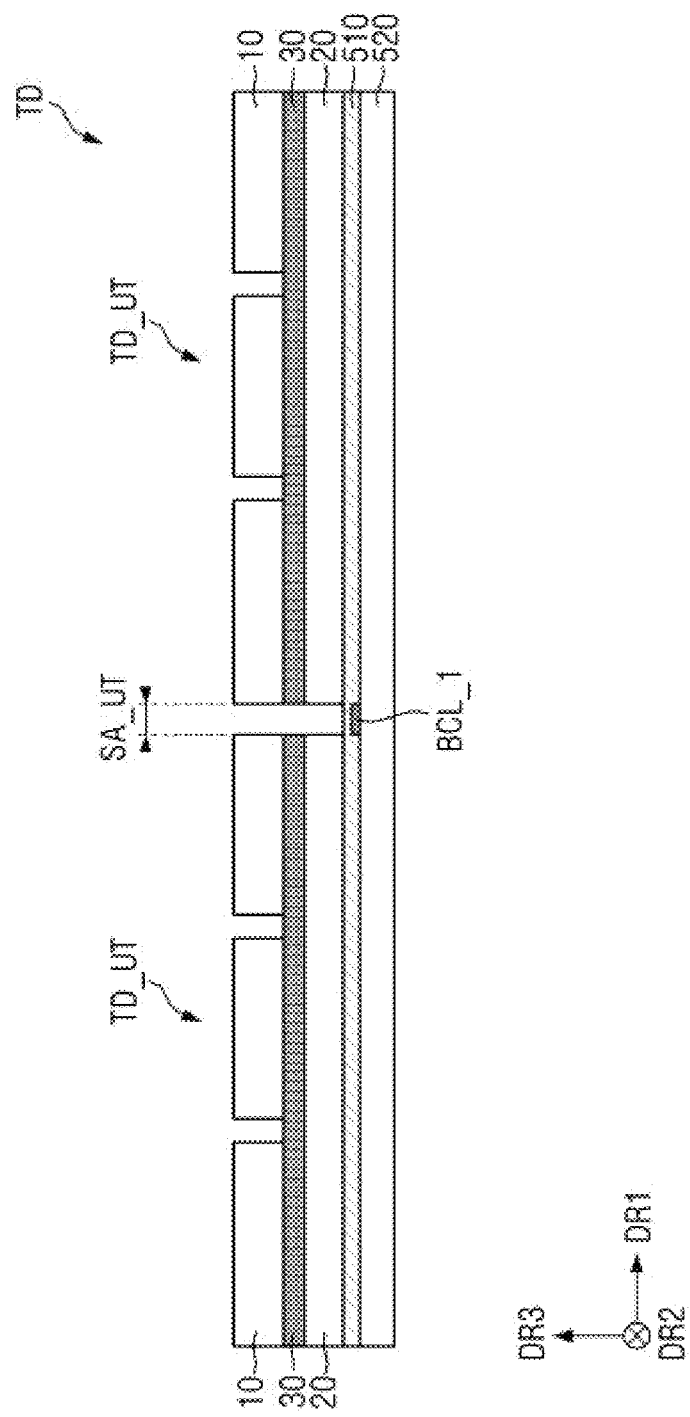
FIG. 22 is a schematic cross-sectional view of an example of the tiled display device of FIG. 19, taken along the long side direction of the tiled display device.

FIG. 20 is a schematic cross-sectional view of an example of the tiled display device TD of FIG. 19, taken along a long side direction of the tiled display device TD. FIG. 21 is a schematic cross-sectional view of an example of the tiled display device TD of FIG. 19, taken along the long side direction of the tiled display device TD. FIG. 22 is a schematic cross-sectional view of an example of the tiled display device TD of FIG. 19, taken along the long side direction of the tiled display device TD.

Referring to FIGS. 20 through 22, tiled display units TD_UT may be disposed on a bottom plate 520 and a heat dissipation part 510. The bottom plate 520 and the heat dissipation part 510 disposed under or below the tiled display units TD_UT may cover or overlap the tiled display units TD_UT. The tiled display device TD may further include a light blocking layer disposed in the separation area SA_UT between the tiled display units TD_UT.

For example, a tiled display device TD of FIG. 20 may include a light blocking layer BCL disposed in a separation area SA_UT between tiled display units TD_UT. The light blocking layer BCL may include a light blocking material. The light blocking layer BCL may be disposed in the separation area SA_UT between the tiled display units TD_UT to prevent the separation area SA_UT from being recognized by a user. The light blocking layer BCL may be disposed on a heat dissipation part 510 in the separation area SA_UT between the tiled display units TD_UT. The light blocking layer BCL may be coated on the heat dissipation part 510.

In a tiled display device TD of FIG. 21, a surface of a heat dissipation part 510_1 overlapping a separation area SA_UT between tiled display units TD_UT may be treated to form a black area. Therefore, the heat dissipation part 510_1 may include an area 511 overlapping the tiled display units TD_UT and an area 512 not overlapping the tiled display units TD_UT. A surface of the area 512 of the heat dissipation part 510_1 may be treated to block light.

A tiled display device TD of FIG. 22 may include a light blocking layer BCL_1 disposed in a separation area SA_UT between tiled display units TD_UT. The light blocking layer BCL_1 may be disposed on a bottom plate 520 in the separation area SA_UT between the tiled display units TD_UT, and a heat dissipation part 510 may be disposed on the light blocking layer BCL_1.

Figure 23:
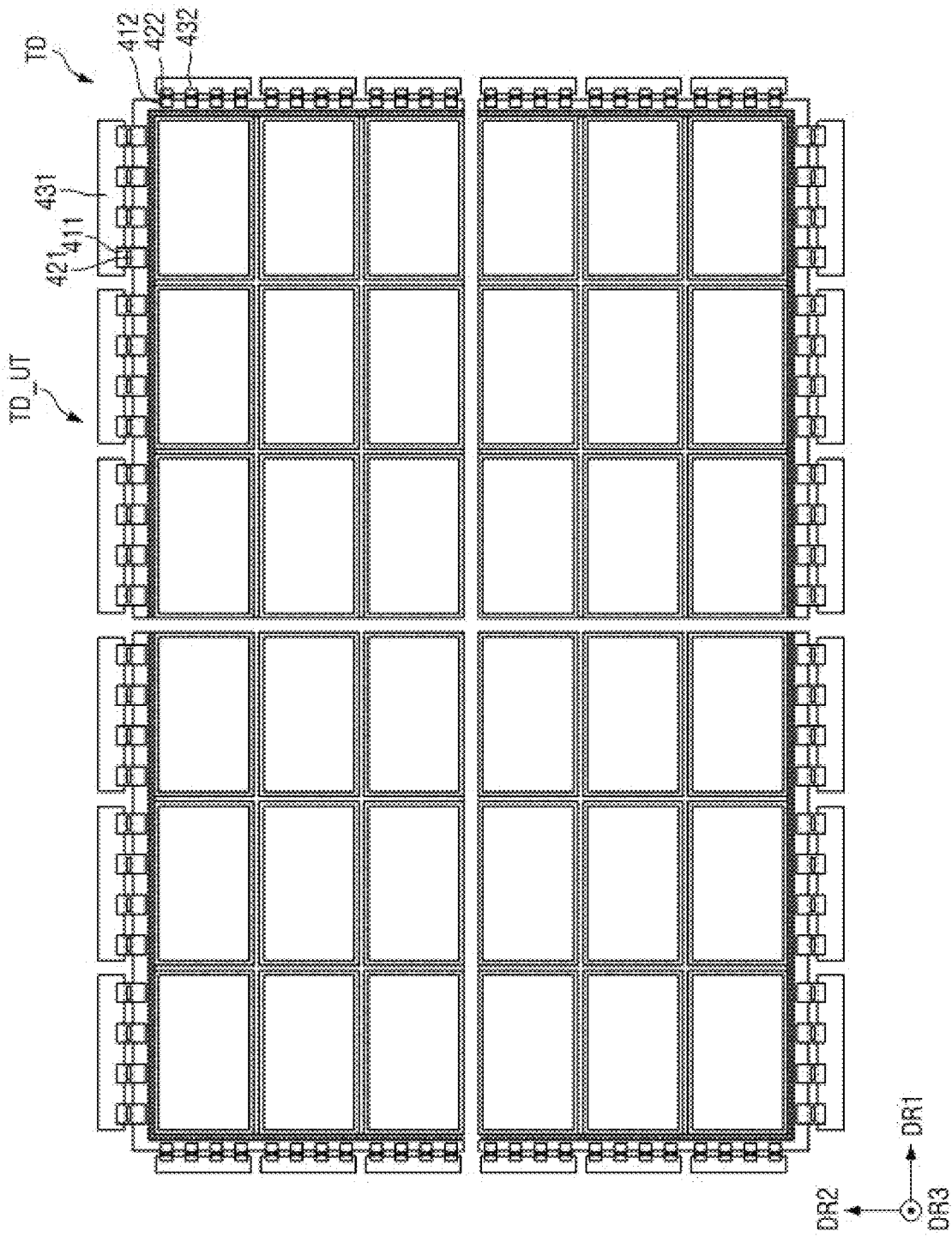
FIG. 23 is a schematic plan view of a tiled display device according to an embodiment.

FIG. 23 is a schematic plan view of a tiled display device TD according to an embodiment.

Referring to FIG. 23, the tiled display device TD according to the current embodiment may include tiled display units TD_UT, similarly to FIG. 19. Each of the tiled display units TD_UT may be substantially the same as the tiled display device TD described above with reference to FIG. 19. For example, each of the tiled display units TD_UT may include display devices 10, a base part 20, a conductive adhesive part 30, first and second flexible films 411 and 412, first and second display drivers 421 and 422, and first and second circuit boards 431 and 432.

The first and second flexible films 411 and 412, the first and second display drivers 421 and 422, and the first and second circuit boards 431 and 432 of the tiled display units TD_UT included in the tiled display device TD according to the current embodiment may be disposed to face outward from the tiled display device TD. For example, the first and second flexible films 411 and 412, the first and second display drivers 421 and 422, and the first and second circuit boards 431 and 432 of the tiled display units TD_UT may be disposed adjacent to upper, lower, right and left sides of the tiled display device TD.

Figure 24:
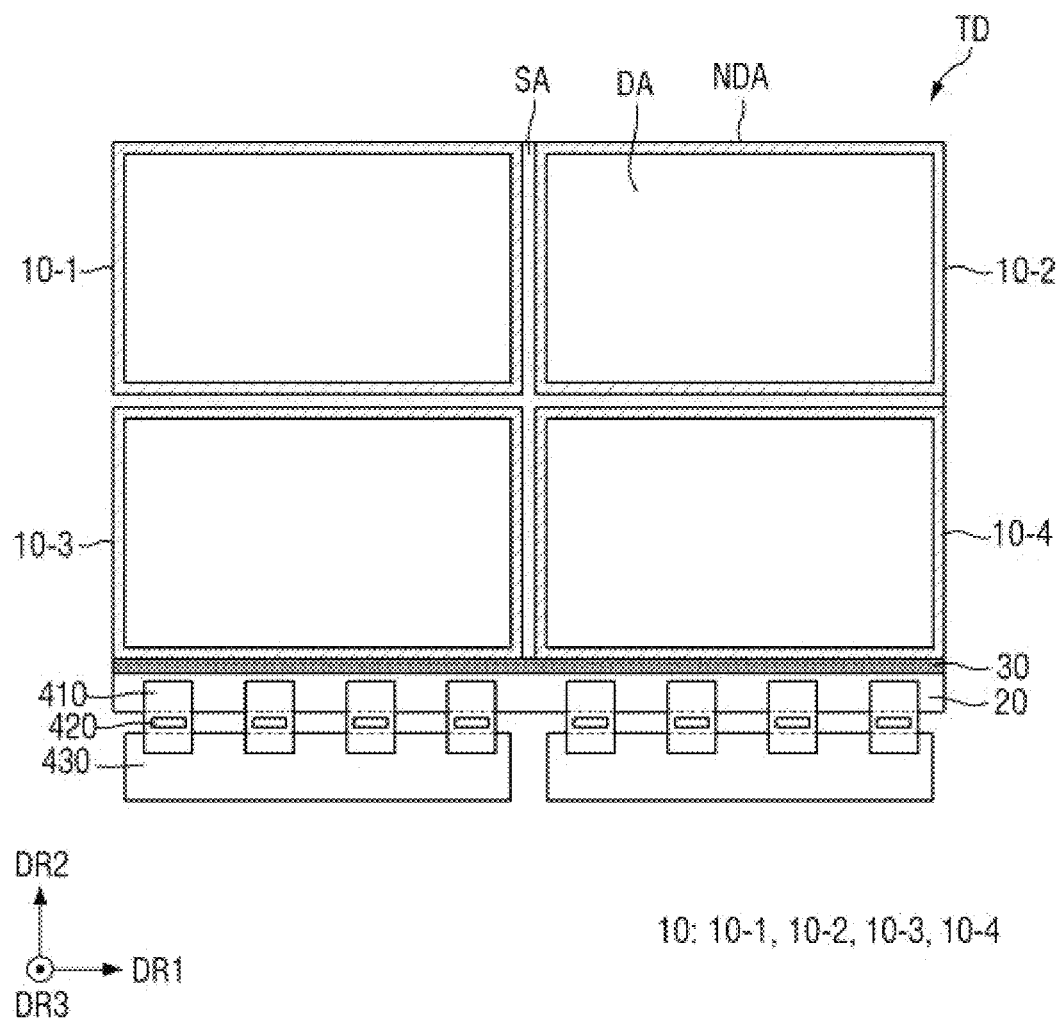
FIG. 24 is a schematic plan view of a tiled display device according to an embodiment.

FIG. 24 is a schematic plan view of a tiled display device TD according to an embodiment.

The tiled display device TD according to an embodiment may be different from an embodiment of FIG. 1 in that display devices 10-1 through 10-4 are arranged in a 2×2 matrix shape on a base part 20. The size of each display device 10 may be different from that of each display device 10 of FIG. 1 so that the display devices 10 can be arranged in a 2×2 matrix on the base part 20 having a same area as the base part 20 of FIG. 1. For example, the arrangement of the display devices 10 may be readily adjusted by adjusting the area of each display device 10 on the base part 20 having a same area as the base part 20 of FIG. 1.

In a tiled display device according to the disclosure, a base substrate (a first substrate) of a base part may include a material having the same coefficient of thermal expansion as that of a base substrate (a second substrate) of a display device to prevent damage to the display device.

In a tiled display device according to the disclosure, a conductive adhesive part electrically connecting a base part and display devices may include a light blocking material to prevent an area between the display devices from being recognized by a user.

In a tiled display device according to the disclosure, the arrangement and number of display devices can be readily designed by forming a pad part on a base part on which display devices are disposed and omitting the pad part from each of the display devices.

However, the effects of the disclosure are not restricted to those set forth herein. The above and other effects of the disclosure will become more apparent to one of ordinary skill in the art to which the disclosure pertains by referencing the claims.

What is claimed is:

1. A tiled display device comprising:
   a base part comprising:
   a first substrate; and a pad part;
   display devices disposed on the base part, each of the display devices comprising:
   a second substrate; and
   a display layer disposed on an upper surface of the second substrate; and
   a conductive adhesive part disposed between the base part and the display devices, electrically connecting the base part to the display devices, and comprising a black material, wherein
   each of the display devices comprises a first connection pattern and a second connection pattern, wherein the first connection pattern is disposed on a lower surface of the second substrate and the second connection pattern is included in the display layer and exposed on a lower surface of the display layer.

2. The tiled display device of claim 1, wherein the conductive adhesive part comprises an adhesive layer bonding the first substrate and the second substrate.

3. The tiled display device of claim 1, wherein
   the display devices are spaced apart from each other on the first substrate, and
   the conductive adhesive part is exposed in an area between the display devices.

4. The tiled display device of claim 1, wherein
   the first substrate comprises:
   a first area; and
   a pad area spaced apart from a side of the first area,
   the display devices are disposed on the first area of the first substrate, and
   the pad part is disposed on the pad area of the first substrate.

5. The tiled display device of claim 4, wherein the conductive adhesive part is disposed entirely on the first area of the first substrate.

6. The tiled display device of claim 1, wherein the base part comprises an external signal line disposed on an upper surface of the first substrate and electrically connected to the pad part.

7. The tiled display device of claim 6, wherein the first connection pattern is electrically connected to the external signal line of the base part.

8. The tiled display device of claim 7, wherein the second connection pattern is electrically connected to the first connection pattern through a contact hole penetrating the second substrate.

9. The tiled display device of claim 8, wherein
the first connection pattern is disposed in the contact hole, and
a lower surface of the second connection pattern is disposed on the upper surface of the second substrate.

10. The tiled display device of claim 7, wherein the conductive adhesive part entirely overlaps the external signal line and the first connection pattern.

11. The tiled display device of claim 1, wherein the second substrate and the first substrate comprise a material having a same coefficient of thermal expansion.

12. The tiled display device of claim 1, wherein the conductive adhesive part comprises an anisotropic conductive film.

13. The tiled display device of claim 1, further comprising:
a light blocking coating layer disposed on a side surface of the second substrate.

14. A tiled display device comprising:
a bottom plate;
a heat dissipation part disposed on the bottom plate; and
tiled displays spaced apart from each other on the heat dissipation part,
wherein each of the tiled displays comprises:
a base part comprising a first substrate and a pad part;
display devices disposed on the base part, each of the display devices comprising:
a second substrate; and
a display layer disposed on an upper surface of the second substrate; and
a conductive adhesive part disposed between the base part and the display devices and electrically connecting the base part to the display devices, the conductive adhesive part comprising a black material, wherein
each of the display devices comprises a first connection pattern and a second connection pattern, wherein the first connection pattern is disposed on a lower surface of the second substrate and the second connection pattern is included in the display layer and exposed on a lower surface of the display layer.

15. The tiled display device of claim 14, further comprising:
a light blocking layer overlapping an area between the tiled displays and disposed on the bottom plate.

16. The tiled display device of claim 14, wherein
the first substrate comprises:
a first area; and
a pad area spaced apart from a side of the first area,
the display devices are disposed on the first area of the first substrate, and
the pad part is disposed on the pad area of the first substrate.

17. The tiled display device of claim 16, wherein the conductive adhesive part is disposed entirely on the first area of the first substrate.

18. The tiled display device of claim 14, wherein
the base part comprises an external signal line disposed on an upper surface of the first substrate and electrically connected to the pad part, and
the first connection pattern is electrically connected to the external signal line of the base part.

19. The tiled display device of claim 18, wherein
the second connection pattern is included in the display layer and is exposed on a lower surface of the display layer, and
the second connection pattern is electrically connected to the first connection pattern through a contact hole penetrating the second substrate.

20. An electronic device including a tiled display device comprising:
the tiled display device comprising:
a base part comprising:
a first substrate; and
a pad part;
display devices disposed on the base part, each of the display devices comprising:
a second substrate; and
a display layer disposed on an upper surface of the second substrate; and
a conductive adhesive part disposed between the base part and the display devices and electrically connecting the base part to the display devices, wherein the conductive adhesive part comprises a black material, wherein
each of the display devices comprises a first connection pattern and a second connection pattern, wherein the first connection pattern is disposed on a lower surface of the second substrate and the second connection pattern is included in the display layer and exposed on a lower surface of the display layer.

* * * * *